(12) United States Patent
Timurdogan et al.

(10) Patent No.: US 9,939,586 B2
(45) Date of Patent: Apr. 10, 2018

(54) APPARATUS, SYSTEMS, AND METHODS FOR WAVEGUIDE-COUPLED RESONANT PHOTON DETECTION

(71) Applicants:Erman Timurdogan, Cambridge, MA (US); Michael R. Watts, Hingham, MA (US); Zhan Su, Cambridge, MA (US); Ehsan Shah Hosseini, Boston, MA (US); Jie Sun, Cambridge, MA (US)

(72) Inventors: Erman Timurdogan, Cambridge, MA (US); Michael R. Watts, Hingham, MA (US); Zhan Su, Cambridge, MA (US); Ehsan Shah Hosseini, Boston, MA (US); Jie Sun, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/419,694

(22) Filed: Jan. 30, 2017

(65) Prior Publication Data

US 2017/0219776 A1 Aug. 3, 2017

Related U.S. Application Data

(60) Provisional application No. 62/287,970, filed on Jan. 28, 2016.

(51) Int. Cl.
*G02B 6/12* (2006.01)
*G02B 6/293* (2006.01)
(Continued)

(52) U.S. Cl.
CPC ......... *G02B 6/29338* (2013.01); *G02B 6/122* (2013.01); *G02B 6/29395* (2013.01);
(Continued)

(58) Field of Classification Search
CPC .......................... G02B 6/122; G02B 6/29338; G02B 6/29385; G02B 2006/12061; G02B 2006/12123
See application file for complete search history.

(56) References Cited

U.S. PATENT DOCUMENTS 6,222,951 B1 4/2001 Huang
7,251,386 B1 7/2007 Dickinson et al.
(Continued)

OTHER PUBLICATIONS

International Search Report and Written Opinion dated Sep. 7, 2017 from International Application No. PCT/US2017/015599, 10 pages.
(Continued)

*Primary Examiner* — Rhonda Peace
(74) *Attorney, Agent, or Firm* — Cooley LLP

(57) ABSTRACT

A photodetector includes a germanium layer evanescently coupled to a ring resonator. The ring resonator increases the interaction length between light guided by the ring resonator and the germanium layer without increasing the size of the photodetector, thereby keeping the photodetector's dark current at a low level. The germanium layer absorbs the guided light and converts the absorbed light into electrical signals for detection. The increased interaction length in the resonator allows efficient transfer of light from the resonator to the germanium layer via evanescently coupling. In addition, the internal and external quality factors (Q) of the ring resonator can be matched to achieve (nearly) full absorption of light in the germanium with high quantum efficiency.

26 Claims, 16 Drawing Sheets

(51) Int. Cl.
*G02B 6/122* (2006.01)
*H01L 31/105* (2006.01)
*H01L 31/0352* (2006.01)

(52) U.S. Cl.
CPC .... *H01L 31/035281* (2013.01); *H01L 31/105* (2013.01); *H01L 31/1055* (2013.01); *G02B 2006/12061* (2013.01); *G02B 2006/12123* (2013.01)

(56) References Cited

U.S. PATENT DOCUMENTS

| | | | |
|---|---|---|---|
| 7,266,263 | B2 | 9/2007 | Ahn et al. |
| 7,305,157 | B2 | 12/2007 | Ahn et al. |
| 7,397,101 | B1 | 7/2008 | Masini et al. |
| 7,453,132 | B1 | 11/2008 | Gunn, III et al. |
| 7,532,656 | B2 | 5/2009 | Yang et al. |
| 7,613,369 | B2 * | 11/2009 | Witzens ............ G02B 6/12007 257/E21.578 |
| 8,324,660 | B2 | 12/2012 | Lochtefeld et al. |
| 8,582,937 | B2 * | 11/2013 | Xu ........................ G02F 1/025 385/50 |
| 8,592,745 | B2 | 11/2013 | Masini et al. |
| 8,805,130 | B2 | 8/2014 | Lipson et al. |
| 9,171,996 | B2 * | 10/2015 | Kim ...................... H01L 33/06 |
| 9,437,759 | B2 * | 9/2016 | Baehr-Jones ....... H01L 31/1808 |
| 2003/0116762 | A1 | 6/2003 | Hwang et al. |
| 2008/0150069 | A1 | 6/2008 | Popovic et al. |
| 2009/0022500 | A1 | 1/2009 | Pinguet et al. |
| 2011/0058765 | A1 * | 3/2011 | Xu ........................ G02F 1/025 385/2 |
| 2011/0298131 | A1 * | 12/2011 | Hull ........................ G01T 1/24 257/741 |
| 2016/0211402 | A1 * | 7/2016 | Joo ................. H01L 31/022416 |
| 2017/0040487 | A1 * | 2/2017 | Alloatti ............... H01L 31/0352 |

OTHER PUBLICATIONS

Al-Attili et al., "Whispering gallery mode resonances from Ge micro-disks on suspended beams", *Frontiers in Materials*, May 2015, vol. 2, Article 43, 9 Pgs.
Ishikawa et al., "Ge-on-Si photonic devices for photonic-electronic integration on a Si platform", *IECE Electronics Express*, 2014, vol. 11, No. 24, pp. 1-17.
Ishikawa et al., "Germanium for silicon photonics", *Thin Solid Films*, Jan. 2010, vol. 518, pp. 583-587.
Lim et al., "Enhanced photoluminescence from germanium-based ring resonators", Applied Physics Letters, 2008, vol. 93, 4 Pgs.
Little et al., "Wavelength Switching and Routing Using Absorption and Resonance" IEEE Photonics Technology Letters, Jun. 1998, vol. 10, No. 6, pp. 816-818.
Little et al., Microring Resonator Channel Dropping Filters, *Journal of Lightwave Technology*, Jun. 1997, vol. 15, No. 6, pp. 998-1005.
Liu et al., "Ge-on-Si optoelectronics", *Thin Solid Films*, Feb. 2012, vol. 520, Issue 8, pp. 3354-3360.
Mashanovich et al., "Group IV Mid-Infrared Photonics", Proc. of SPIE, 2015, vol. 9367, 11 Pgs.
Roelkens et al., "Silicon-Based Photonic Integration Beyond the Telecommunication Wavelength Range" *IEEE Journal of Selected Topics in Quantum Electronics*, Jul./Aug. 2014, vol. 20, No. 4, 11 Pgs.
Su et al., "Resonant Germanium-on-Silicon Photodetector with Evanescent Waveguide Coupling", *CLEO The Optical Society*, 2016, 2 Pgs.
Timurdogan et al., "An Ultra Low Power 3D Integrated Intra-Chip Silicon Electronic-Photonic Link" *Optical Society of America*, 2015, 3 Pgs.
Watts, "Wavelength Switching and Routing through Evanescently Induced Absorption," MIT Master's Thesis, Jun. 2001, 147 Pgs.

* cited by examiner

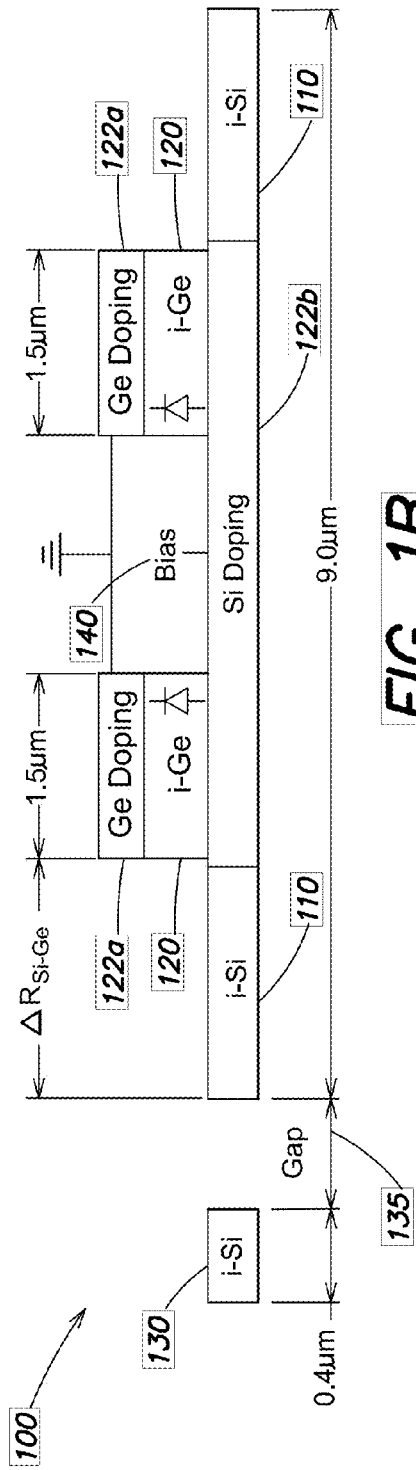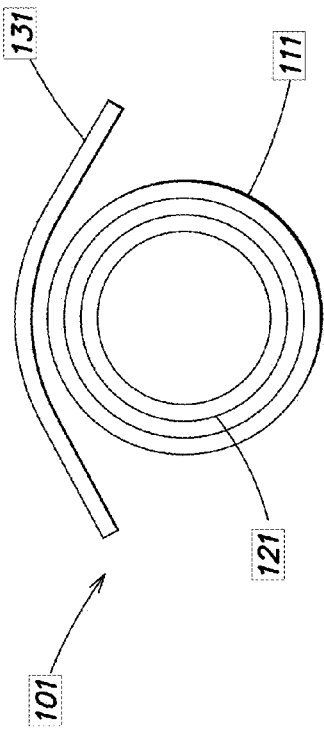

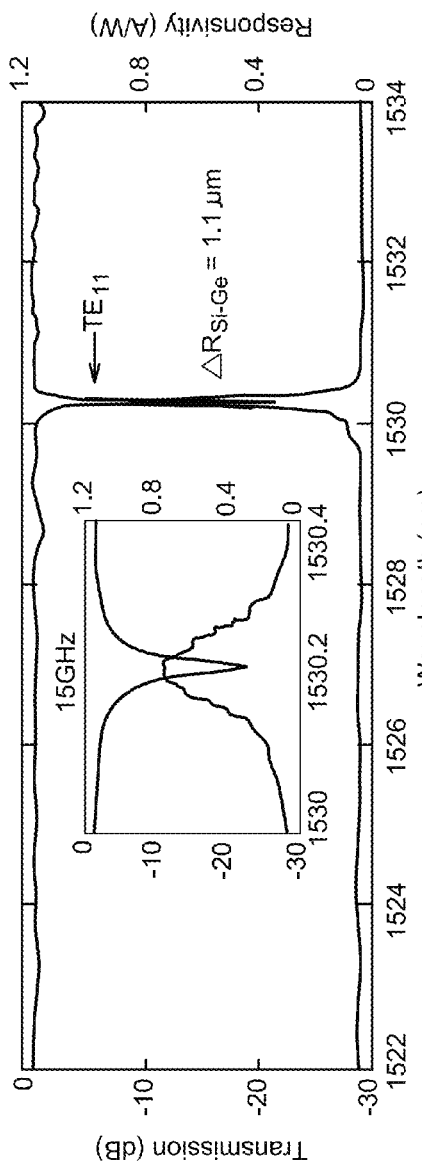
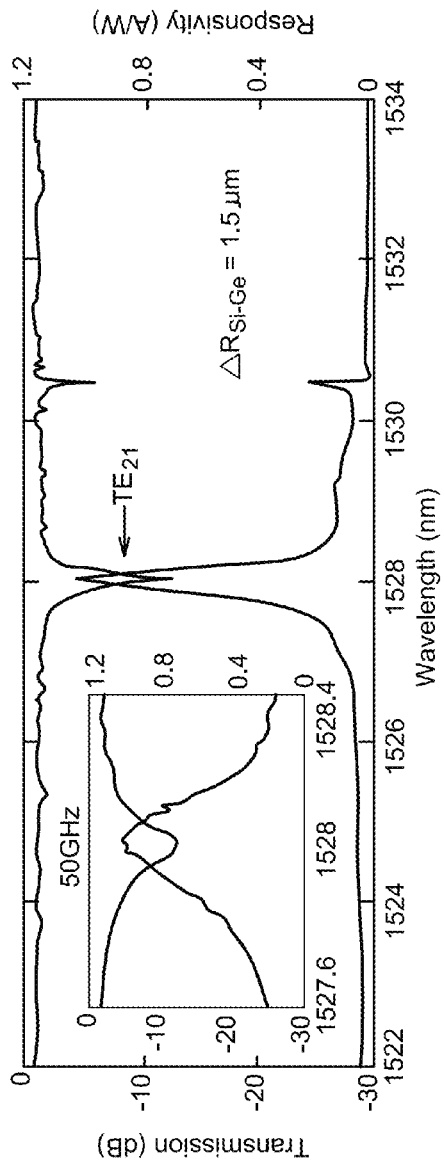
FIG. 12A
FIG. 12B

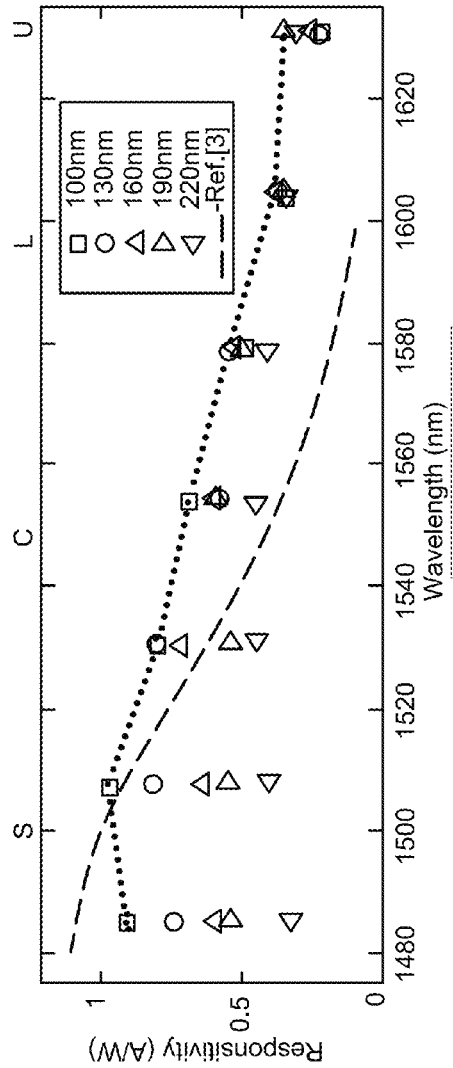
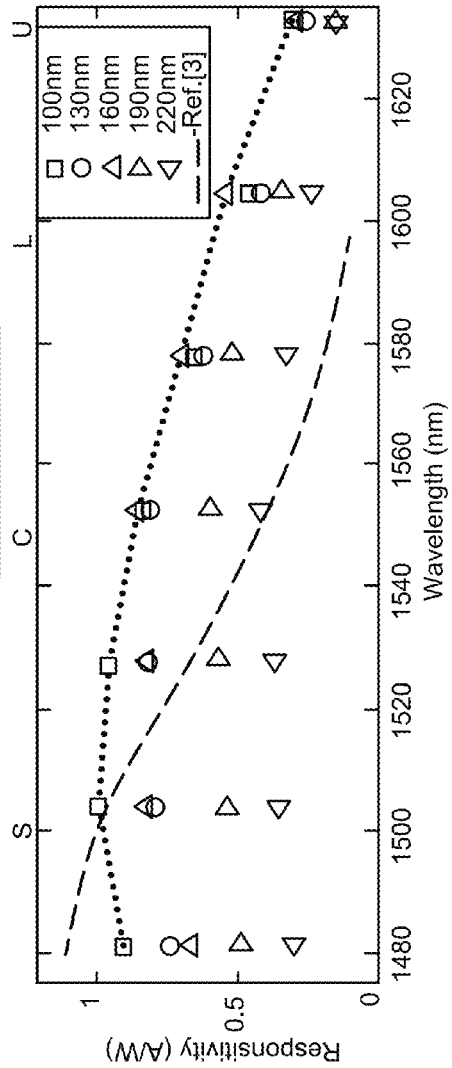
FIG. 14A
FIG. 14B

APPARATUS, SYSTEMS, AND METHODS FOR WAVEGUIDE-COUPLED RESONANT PHOTON DETECTION

CROSS-REFERENCES TO RELATED APPLICATION(S)

This application claims priority to U.S. Application No. 62/287,970, filed Jan. 28, 2016, entitled "WAVEGUIDE-COUPLED RESONANT GERMANIUM-ON-SILICON PHOTODETECTOR," which is hereby incorporated herein by reference in its entirety for all purposes.

GOVERNMENT SUPPORT

This invention was made with Government support under Grant No. HR0011-12-2-0007 awarded by the Defense Advanced Research Projects Agency. The Government has certain rights in the invention

BACKGROUND

Silicon photonics is a technology for implementing various optical functionalities in silicon and provides a promising solution to address the ever-demanding bandwidth and power-consumption bottlenecks in both on-chip and off-chip interconnections. The active involvement of well-established Complementary-Metal-Oxide-Semiconductor (CMOS) foundries paves the way for custom fabrication processes tailored for large-scale electronics-photonics integrations. One step toward this integration is the development of efficient chip-scale photodetectors (PDs) integrated on silicon, especially PDs operating in the near infrared region.

Near-infrared photodetection may be realized in a variety of materials, including germanium, polycrystalline silicon, III-V materials, and two-dimensional materials. Among them, germanium has the advantages of high responsivity and CMOS compatible integration on silicon. The bandgap of germanium makes it a useful photo detecting material for wavelengths below 1.55 μm.

Conventional methods of sub-bandgap photodetection (i.e., photodetection beyond 1.55 μm) with germanium detectors include increasing the detector size. However, increasing the detector size can induce a larger dark current and result in slower speed performance. Alternatively, bulk germanium can be strained to engineer its band gap so as to perform photodetection beyond 1.55 μm. However, the interaction length with strained germanium is still relatively short, thereby limiting the efficiency of photodetection at longer wavelengths (e.g., in the L band from about 1565 to about 1625 nm).

SUMMARY

Apparatus, systems, and methods described herein are generally related to photodetection using germanium evanescently coupled to a resonator. In one example, an apparatus includes a resonator to guide light and a germanium layer, evanescently coupled to the resonator, to absorb at least a portion of the light guided by the resonator. The germanium layer has a first side and a second side opposite the first side. The apparatus also includes a first electrode disposed on the first side of the germanium layer and a second electrode, disposed on the second side of the germanium layer so as to apply a bias voltage on the germanium layer.

In another example, a method includes applying a bias voltage on a germanium layer and guiding light in a resonator evanescently coupled to the germanium layer so as to cause the germanium layer to absorb at least a portion of the light guided in by resonator. The germanium layer converts the at least a portion of the light into an electrical signal. The method also includes detecting the electrical signal.

In yet another example, a semiconductor photodetector includes a ring resonator to guide light at a wavelength greater than about 1500 nm. The ring resonator has an internal quality factor. The semiconductor photodetector also includes an input waveguide, disposed about 50 nm to about 250 nm away from the ring resonator, to couple the light into the ring resonator. A germanium arcuate member is evanescently coupled to the ring resonator and substantially concentric with the ring resonator to absorb at least a portion of the light guided in the ring resonator. The ring resonator has an outer edge disposed about 1 μm to about 2 μm away from an outer edge of the germanium arcuate member. The ring resonator has an external quality factor approximately equal to the internal quality factor of the ring resonator. The semiconductor photodetector also includes a pair of electrodes, in electrical communication with the germanium arcuate member, to apply a bias voltage on the germanium arcuate member.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 1A and 1B show a perspective view and a side view, respectively, of a photodetector including a germanium layer evanescently coupled to a silicon resonator.

FIG. 1C shows a pulley coupling scheme that can be used in the photodetector shown in FIGS. 1A and 1B.

FIGS. 12A-12C show measured transmission spectra and responsivities for photodetectors with $\Delta R_{Si-Ge}$=1.1, 1.5 and 1.8 μm, respectively, at a bus-to-resonant detector gap of 100 nm for a wavelength around 1528 nm.

FIGS. 14A-14C show measured responsivities as a function of resonant wavelength at different coupling gap sizes for germanium-silicon separations $\Delta R_{Si-Ge}$ of 1.1 μm, 1.4 μm, and 1.7 μm, respectively.

DETAILED DESCRIPTION

Overview

To achieve efficient near-infrared photodetection, system, apparatus, and methods descried herein employ a germanium layer evanescently coupled to a resonator. The resonator can efficiently trap incident light and lead to a long interaction length without increasing the size of the detector. Therefore, the dark current of the detector can be maintained at a low level (e.g., on the order of nA). The germanium layer is evanescently coupled to the resonator and absorbs the light propagating in the resonator. The absorbed light is then converted to electrical signals for detection. The increased interaction length in the resonator allows efficient transfer of light from the resonator to the germanium layer via evanescent coupling. In addition, the internal quality factor (Q or Q-factor) (also referred to as the intrinsic Q) and external Q of the resonator can be matched to make this coupling even more efficient, thereby promoting absorption of light in the germanium with high quantum efficiency.

The resonant nature of the technique described herein can further extend the detection wavelength range to 1630 nm with responsivity greater than 0.45 A/W. Therefore, inventive resonant germanium photodetectors can be used for simultaneous detection of light in the S (1460-1530 nm), C (1530-1565 nm) and L (1565-1625 nm) optical communication bands. In addition, due to the wavelength selective nature of resonators, both wavelength filtering and power detection functions are achieved in the same device. As a result, this technique can simplify the architecture for wavelength division-multiplexing (WDM) and multicasting networks.

Photodetectors Including a Germanium Layer Coupled to a Ring Resonator

Figure 1A:
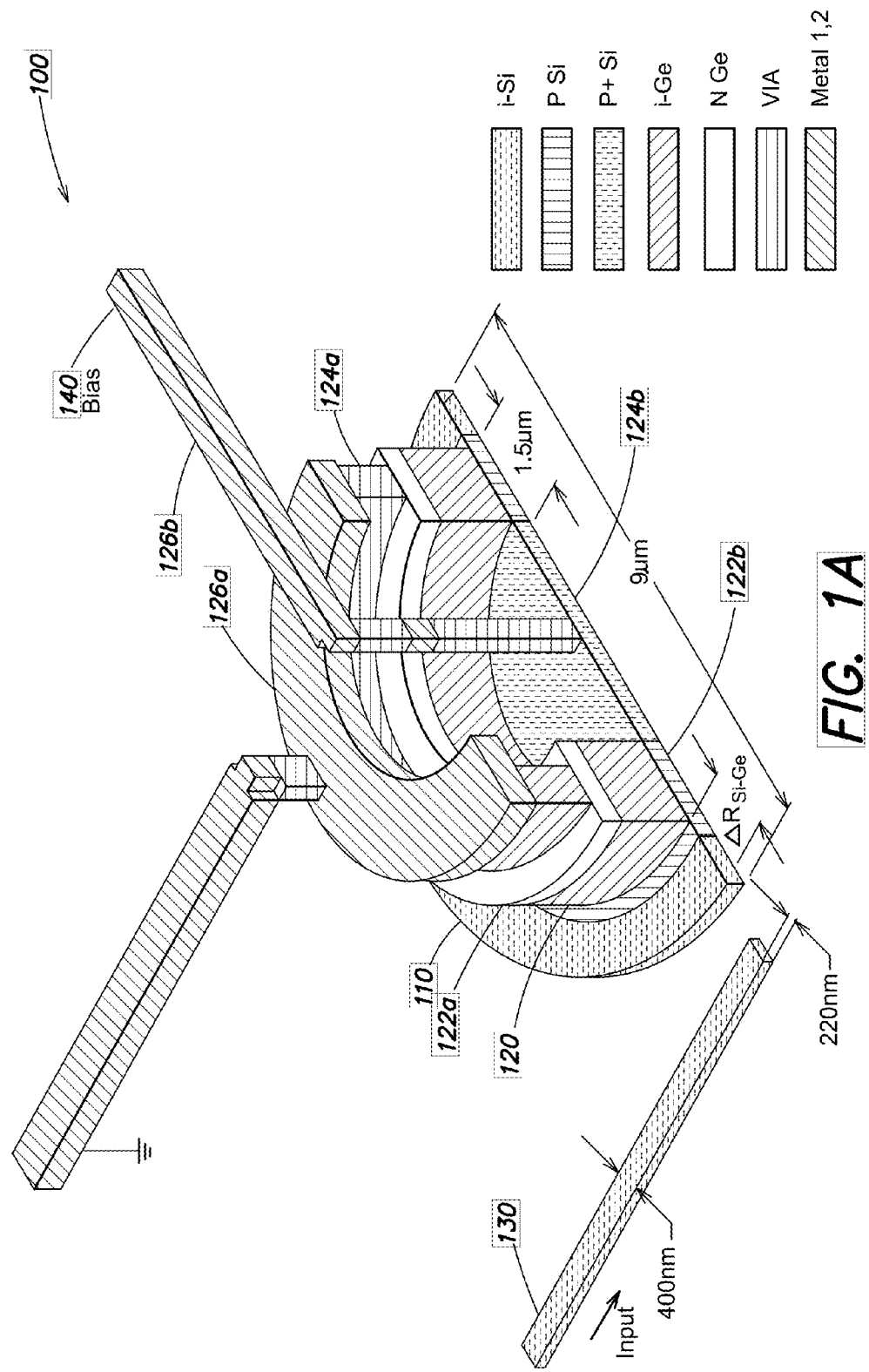

FIGS. 1A and 1B show a perspective view and a side view, respectively, of a photodetector 100 including a (pure) germanium layer 120 evanescently coupled to a silicon resonator 110. Evanescent coupling as used in this application generally refers to the situation where the germanium layer 120 is in close proximity with the resonator 110 such that light field in the resonator 110 can leak into the germanium layer 120. For illustration purposes, FIG. 1A shows only half of the photodetector 100. The resonator 110 in the photodetector 100 is a ring resonator and receives light via an input (bus) waveguide 130 evanescently coupled to the resonator 110. The germanium layer 120 is sandwiched between an N type germanium layer 122a and a P type silicon layer 122b. The N type germanium layer 122a is coupled to a via 124a and the P type silicon layer 122b is coupled to a P+ silicon layer 124b. Two connectors 126a and 126b (e.g., made of aluminum, silver, gold, or any other appropriate conductive material) are electrically coupled to the via 124a and the P+ silicon layer 124b, respectively, so as to apply a bias voltage, provided by a voltage source 140, over the germanium layer 120.

The P type silicon layer 122b and the P+ silicon layer 124b form the P side while the N type germanium layer 122a forms the N side of the p-i-n junction of the detector 100, with the germanium layer 120 forming the intrinsic region. For the metal connector 126a coupled to the germanium layer 120, circular contact is utilized to bring the contact close to where the carriers are generated, which further reduces the device resistance.

In operation, the light guided in the resonator 110 is evanescently coupled into the germanium layer 120, at least due to the high refractive index of the germanium layer 120. The light received by the germanium layer 120 is then absorbed by the germanium layer 120 and converted into electrical signals under the bias voltage applied via the metal connectors 126a and 126b. The wavelength of the absorbed light in the germanium layer 120 can be substantially equal to the resonant wavelength of the resonator 110. Therefore, the operating wavelength of the photodetector 100 can be adjusted by adjusting the resonant wavelength of the resonator 110. In practice, the resonant wavelength of the resonator 110 can be substantially equal to or greater than 1500 nm (e.g., about 1500 nm, about 1510 nm, about 1520 nm, about 1530 nm, about 1540 nm, about 1550 nm, about 1560 nm, about 1570 nm, about 1580 nm, about 1590 nm, about 1600 nm, about 1610 nm, about 1620 nm, or greater). In this case, the photodetector 100 can be configured to detect light in the S band, the L band, and the C band in optical communication systems.

The resonant wavelength of the resonator 110 shown in FIG. 1A can be determined by the diameter (e.g., the mean diameter) of the resonator 110. For example, the diameter of the resonator 110 can be about 1 μm to about 50 μm (e.g., about 1 μm, about 2 μm, about 3 μm, about 5 μm, about 7.5 μm, about 10 μm, about 15 μm, about 20 μm, about 25 μm, about 30 μm, about 40 μm, or about 50 μm, including any values and sub ranges in between).

The resonator 110 can use various types of materials. In one example, the resonator 110 can include silicon, such as intrinsic silicon. In another example, the resonator 110 can include silicon oxide, such as SiO$_2$. In yet another example, the resonator 110 can includes silicon nitride, such as SiN or Si$_3$N$_4$.

In one example, the resonator 110 acts as a single-mode waveguide for the light propagating in the resonator 110. In another example, the resonator 110 acts as a multimode waveguide for the light propagating in the resonator 110.

The cross section of the resonator 110 can have various shapes, such as rectangular, square, round (e.g., a fiber), oval, or any other shape known in the art. In one example, as shown in FIG. 1B, the cross section of the resonator 110 is rectangular. The width of the cross section can be about 100 nm to about 2 µm (e.g., about 100 nm, about 200 nm, about 300 nm, about 500 nm, about 1 µm, or about 2 µm, including any values and sub ranges in between). In FIG. 1B, the resonator 110 is about 9.0 µm wide. The height of the cross section can be about 50 nm to about 2 µm (e.g., about 50 nm, about 100 nm, about 200 nm, about 300 nm, about 500 nm, about 1 µm, or about 2 µm, including any values and sub ranges in between).

The resonator 110 as shown in FIG. 1A receives light from the input waveguide 130. In one example, the resonator 110 and the input waveguide 130 can be made of the same material, such as silicon. In another example, the resonator 110 and the input waveguide 130 can be made of different materials. In one example, the dimensions of the cross section of the input waveguide 130 can be substantially similar to the dimensions of the cross section of the resonator 110. In another example, the dimensions of the cross section of the input waveguide 130 can be different from the dimensions of the cross section of the resonator 110.

The cross section of the input waveguide 130 can also have various shapes, such as rectangular, square, round, oval, or any other shape known in the art. In one example, as shown in FIG. 1B, the cross section of the input waveguide 130 is rectangular defined by a width and a height (also referred to as thickness). The width of the cross section can be about 100 nm to about 2 µm (e.g., about 100 nm, about 200 nm, about 300 nm, about 500 nm, about 1 µm, or about 2 µm, including any values and sub ranges in between). In FIG. 1B, the input waveguide is about 0.4 µm wide. The height of the cross section can be about 50 nm to about 2 µm (e.g., about 50 nm, about 100 nm, about 200 nm, about 300 nm, about 500 nm, about 1 µm, or about 2 µm, including any values and sub ranges in between).

The input waveguide 130 is evanescently coupled to the resonator 110 across a gap 135 (see FIG. 1B). The gap 135 can have a width of about 50 nm to about 250 nm (e.g., about 50 nm, about 75 nm, about 100 nm, about 125 nm, about 150 nm, about 175 nm, about 200 nm, about 225 nm, or about 250 nm, including any values and sub ranges in between). In one example, the gap 135 can be filled with air. In another example, the gap 135 can be filled with a dielectric material, such as silicon oxide.

The germanium layer 120 as shown in FIG. 1A is formed in the shape of an arcuate member, such as a C-shaped ring or a closed ring, that is substantially concentric with the resonator 110. In another example, the germanium layer 120 can include a germanium ridge, which has at least a portion of the ridge evanescently coupled to the resonator for light detection. For example, In one example, the germanium layer 120 is formed into a pure germanium ring having a diameter less than the diameter of the resonator 110. The distance between the outer edge of the germanium layer 120 and the outer edge of the resonator 110 is designated as $\Delta R_{Si-Ge}$ in FIGS. 1A and 1B. This distance $\Delta R_{Si-Ge}$ can affect the coupling strength between the resonator 110 and the germanium layer 120. Without being bound to any particular theory, a smaller $\Delta R_{Si-Ge}$ can lead to a stronger coupling, leading to a larger leakage of optical modes from the resonator 110 into the germanium layer 120 (see, e.g., description with reference to FIG. 10). A strong coupling can allow the construction of broadband detector. On the other hand, a larger $\Delta R_{Si-Ge}$ can lead to a weaker coupling, which in turn can allow the construction of narrowband detectors and/or filters. In one example, the distance $\Delta R_{Si-Ge}$ can be about 100 nm to about 3 µm (e.g., about 100 nm, about 200 nm, about 500 nm, about 800 nm, about 1 µm, about 1.2 µm, about 1.4 µm, about 1.6 µm, about 1.8 µm, about 2.0 µm, about 2.2 µm, about 2.4 µm, about 2.6 µm, about 2.8 µm, or about 3 µm, including any values and sub ranges in between).

The thickness of the germanium layer 120 can affect the absorption efficiency of the resulting photodetector 100. In general, a thicker germanium layer 120 can decrease the probability for a photon to escape the germanium layer 120, thereby increasing the absorption efficiency. On the other hand, increasing the thickness of the germanium layer 120 may also increase the power consumption of the resulting photodetector 100. In practice, the thickness of the germanium layer 120 can be about 10 nm to about 5 µm (e.g., about 10 nm, about 20 nm, about 50 nm, about 100 nm, about 200 nm, about 300 nm, about 400 nm, about 500 nm, about 600 nm, about 700 nm, about 800 nm, about 900 nm, about 1 µm, about 2 µm, about 3 µm, about 4 µm, or about 5 µm, including any values and sub ranges in between). In some examples, germanium layers less than 10 nm can also be used.

The width of the germanium layer 120 can be about 500 nm to about 10 µm (e.g., about 500 nm, about 1 µm, about 1.5 µm, about 2 µm, about 3 µm, about 4 µm, about 5 µm, about 6 µm, about 7 µm, about 8 µm, about 9 µm, or about 10 µm, including any values and sub ranges in between).

The absorption of light in the germanium layer 120 can be increased by matching the internal quality factor $Q_{int}$ of the resonator 110 with the external quality factor $Q_{ext}$ of the resonator 110. Without being bound by any particular theory of mode of operation, the internal quality factor and the external quality factor can be defined as:

$$Q_{int} = \frac{\omega \tau_e \tau_d}{2(\tau_e + \tau_d)} \quad (1)$$

$$Q_{ext} = \frac{\omega \tau_l}{2} \quad (2)$$

where $\tau_e$ is the decay due to the coupling to the input waveguide 130, $\tau_d$ is the decay due to the coupling to any output waveguide (not shown in FIGS. 1A-1B), and $\tau_l$ is the decay due to scattering, absorption, and radiation losses in the resonator 110.

The internal quality factor $Q_{int}$ and the external quality factor $Q_{ext}$ can range from about 10 to about 100,000 (e.g., about 10, about 100, about 1000, about 10,000, about 100,000, including any values and sub ranges in between). Through matching the external quality factor (Q-factor) to the intrinsic Q-factor of the resonator 110, power at the resonant wavelength of the resonator 110 can be fully absorbed with high quantum efficiency. The difference between the internal quality factor $Q_{int}$ and the external quality factor $Q_{ext}$ can be about 10% to about 100% of the internal quality factor $Q_{int}$ or the external quality factor $Q_{ext}$, whichever is smaller (e.g., about 10%, about 20%, about 30%, about 40%, about 50%, about 60%, about 70%, about 80%, about 90%, or about 100%, including any values and sub ranges in between).

In practice, the external quality factor $Q_{ext}$ can be dynamically tuned via, for example, a switching mechanism (e.g., turning the photodetector on and off). This dynamic tuning can facilitate the matching with the internal quality factor $Q_{int}$. Besides, micro-resonator design and evanescent coupling can also decrease back-reflection, which usually limits the responsivity in butt-coupled photodetectors.

The voltage source 140 in the photodetector 100 provides the bias voltage applied on the germanium layer 120 for photodetection. Generally, a higher bias voltage can lead to a larger detection bandwidth (see, e.g., FIGS. 15A-15B below). The bias voltage can be about −0.2 V to about −15 V (e.g., about −0.2 V, about −0.4 V, about −0.6 V, about −0.8 V, about −1 V, about −2 V, about −3 V, about −4 V, about −5 V, about −7.5 V, about −10V, about −12.5 V, or about −15 V, including any values and sub ranges in between).

The photodetector 100 can be configured to have a variable operating wavelength by adjusting the resonant wavelength of the resonator 110. In one example, the photodetector 100 can include a heater (see, e.g., FIG. 4) to change the temperature of the resonator 110 so as to change the resonant wavelength of the resonator 110 (i.e., thermal tuning). In another example, the resonant wavelength of the resonator 110 can be adjusted via mechanical force (e.g., a strain force applied with a piezoelectric element). The thermal and/mechanical tuning can affect the quality factor of the resonator 110. In addition, the tuning of resonant wavelength can also be helpful for channel dropping and/or selecting (e.g., in filters).

The input waveguide 130 shown in FIGS. 1A-1B includes a straight waveguide evanescently coupled to the resonator 110. In practice, other coupling schemes can also be used to couple the input waveguide 130 with the resonator 110.

FIG. 1C shows a pulley coupling scheme 101 that can be used in the photodetector 100. In the scheme 101, the input waveguide 131 is curved (also referred to as a wrap-around coupling waveguide) to wrap around a ring resonator 111 evanescently coupled to a germanium layer 121. This coupling scheme 101 has a longer interaction length between the input waveguide 131 and the ring resonator 111 compared to conventional evanescently coupling using a straight waveguide. Accordingly, this pulley coupling scheme 101 can allow for selective coupling to a certain mode while maintaining large coupling coefficient into the cavity. This scheme can also remove the additional excitations of other modes and extend the free-spectral-range (FSR) of the device. More details of this pulley coupling scheme can be found in Ehsan Shah Hosseini et al., "Systematic design and fabrication of high-Q single-mode pulley-coupled planar silicon nitride microdisk resonators at visible wavelengths," OPTICS EXPRESS, Vol. 18, No. 3, 2127 (2010), which is hereby incorporated herein by reference in their entirety for all purposes.

Photodetectors Including a Germanium Layer Coupled to a Linear Resonator

The photodetector 100 shown in FIGS. 1A-1B uses a ring resonator 110 to guide light. In practice, other types of resonators, including linear resonators, can also be used to guide light for evanescent coupling into a germanium active region.

Figure 2:
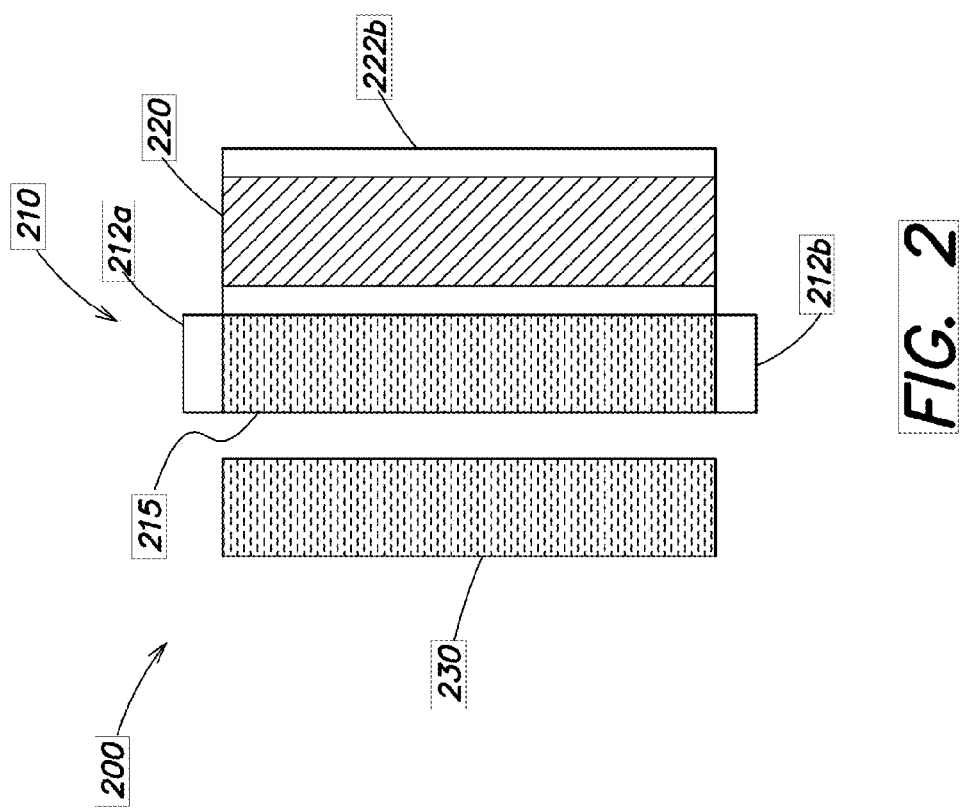
FIG. 2 shows a top view of a photodetector including a germanium layer evanescently coupled to a linear resonator that is evanescently coupled to an input waveguide.

FIG. 2 shows a top view of a photodetector 200 including a (pure) germanium layer 220 evanescently coupled to a linear resonator 210 that is in turn evanescently coupled to an input waveguide 230. The linear resonator 210 includes a linear waveguide 215 disposed between two reflectors 212a and 212b. The linear waveguide 215 is substantially parallel with the input waveguide 230 so as to facilitate evanescent coupling between the linear resonator 210 and the input waveguide 230. The germanium layer 220 is disposed between a top electrode (not shown in FIG. 2) and a bottom electrode 222b to receive the bias voltage.

Since the linear resonator 210 receives light from the input waveguide 230 via evanescently coupling, the two reflectors 212a and 212b in the linear resonator 210 can be highly reflective at the operating wavelength of the photodetector 200. For example, the reflectivity of the reflectors 212a and 212b can be greater than 90% (e.g., greater than 95%, greater than 97%, greater than 99%, or greater than 99.5%, including any values and sub ranges in between). Alternatively, the reflectors 212a and 212b can be partially reflective.

In one example, the reflectors 212a and 212b can include metal layers coated on the end of the linear waveguide 215. In another example, the reflectors 212a and 212b can include semiconductor reflectors, such as Bragg reflectors, fabricated in the linear waveguide 215. They can also be formed by facets at the ends of the linear waveguide 215.

The gap between the input waveguide 230 and the linear resonator 210 can be about 50 nm to about 250 nm (e.g., about 50 nm, about 75 nm, about 100 nm, about 125 nm, about 150 nm, about 175 nm, about 200 nm, about 225 nm, or about 250 nm, including any values and sub ranges in between). In one example, the gap 135 can be filled with air. In another example, the gap 135 can be filled with a dielectric material, such as silicon oxide.

The distance between the germanium layer 220 and the linear resonator 210 can be about 800 nm to about 3 μm (e.g., about 800 nm, about 900 nm, about 1 μm, about 1.1 μm, about 1.2 μm, about 1.3 μm, about 1.4 μm, about 1.5 μm, about 1.6 μm, about 1.7 μm, about 1.8 μm, about 1.9 μm, about 2 μm, about 2.2 μm, about 2.4 μm, about 2.6 μm, about 2.8 μm, or about 3 μm, including any values and sub ranges in between).

The materials and cross sections of the input waveguide 230, the linear resonator 210, and the germanium layer 220 can be substantially to the materials and cross sections of the input waveguide 130, the resonator 110, and the germanium layer 120, respectively, shown in FIGS. 1A-1B and described above. Detailed descriptions are therefore not repeated here.

Figure 3:
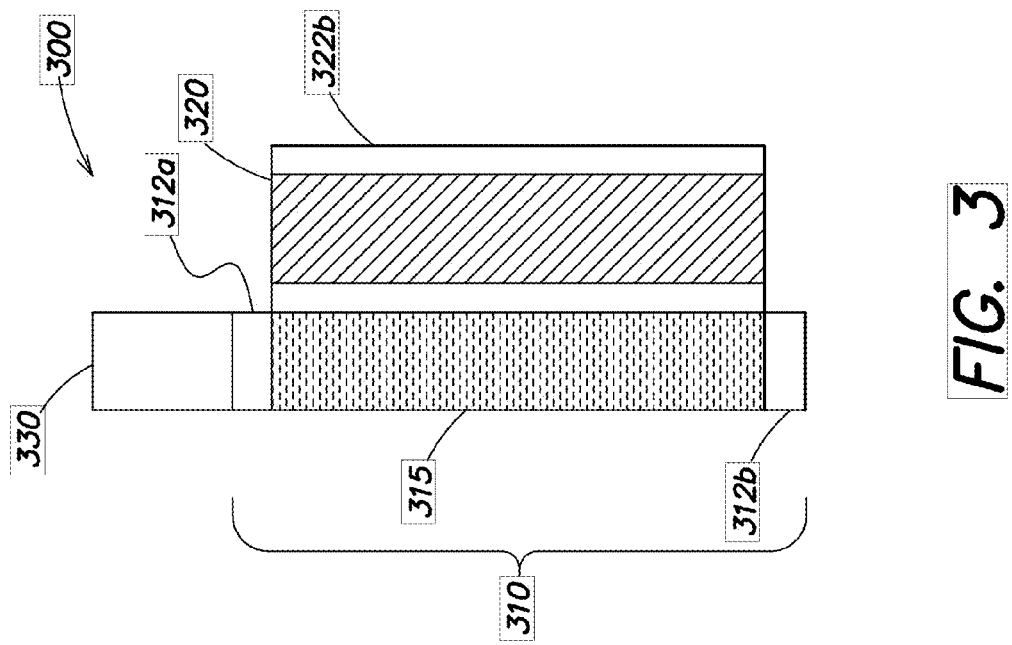
FIG. 3 shows a top view of a photodetector including a germanium layer evanescently coupled to a linear resonator that is end-coupled to an input waveguide.

FIG. 3 shows a top view of a photodetector 300 including a germanium layer 320 evanescently coupled to a linear resonator 310 that is end-coupled to an input waveguide 330. The linear resonator 310 further includes a linear waveguide 315 with two end reflectors 312a and 312b. The reflector 312a is also employed as an input coupler to receive light from the input waveguide end-coupled (also referred to as butt-coupled) to the linear waveguide 315. In this case, the reflector 312a can be partially reflective. For example, the reflector 312a can have a reflectivity less than 99.9% (e.g., less than 99.5%, less than 99%, or less than 95%, including any values and sub ranges in between).

The reflector 312b can be used as an output coupler to couple out light that is not absorbed by the germanium layer 320. The reflectivity of the reflector 312b can also be less than 99.9% (e.g., less than 99.5%, less than 99%, or less than 95%, including any values and sub ranges in between).

In some cases, the reflector 312b can have a variable reflectivity (and transmission). For example, the reflector 312b can have a high reflectivity when the photodetector 300 is used for photodetection. The reflector 312b can have a lower reflectivity when the photodetector 300 is used for filtering and delivering the light not absorbed by the germanium layer 320 is desirable. For example, the reflector 312b can include a wave plate combined with a polarizer. A user can rotate the wave plate so as to change the polarization of the light and therefore the reflectivity of the polarizer.

The materials and cross sections of the input waveguide 330, the linear resonator 310, and the germanium layer 320 can be substantially to the materials and cross sections of the input waveguide 130, the resonator 110, and the germanium layer 120, respectively, shown in FIGS. 1A-1B and described above. Detailed descriptions are therefore not repeated here.

Photodetectors Including Multiple Resonators

Figure 4:
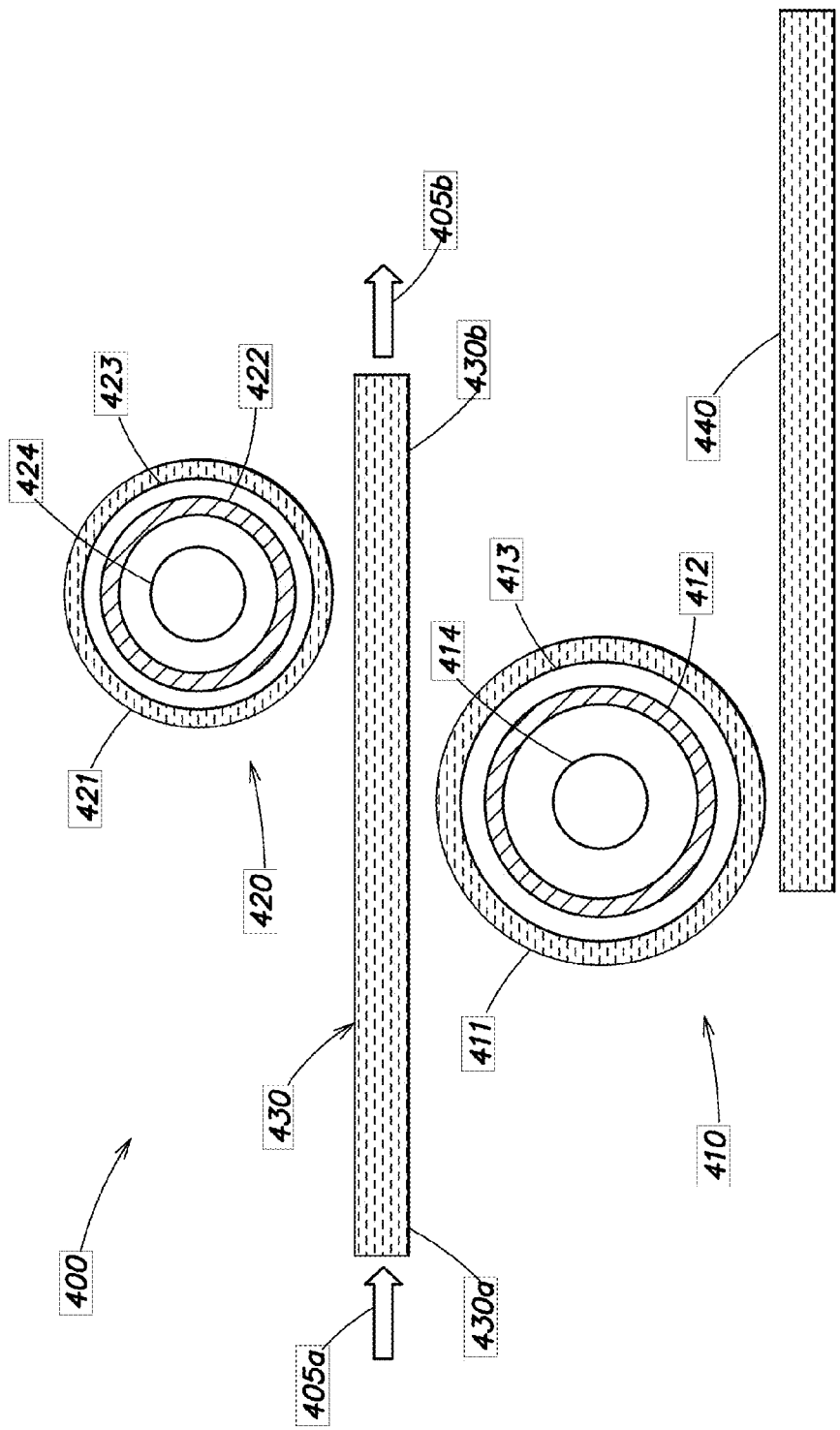
FIG. 4 shows a top view of a photo-detecting apparatus including two resonant germanium detectors.

FIG. 4 shows a top view of a photo detecting apparatus 400 including two resonant germanium detectors 410 and 420, each of which is evanescently coupled to a bus waveguide 430 with an input portion 430a that receives input light 405a. The first germanium detector 410 includes a germanium ring 412 evanescently coupled to a ring resonator 411. The germanium ring 412 is disposed between a bottom electrode 413 and a top electrode (not shown in FIG. 4). The first germanium detector 410 also includes a heater 414, in thermal communication with the ring resonator 411, to change the temperature of the ring resonator 411 and therefore the resonant wavelength of the ring resonator 411. Similarly, the second germanium detector 420 includes a germanium ring 422 evanescently coupled to a ring resonator 421. The germanium ring 422 is disposed between a bottom electrode 423 and a top electrode (not shown in FIG. 4). The first germanium detector 420 also includes a heater 424, in thermal communication with the ring resonator 421, to change the temperature of the ring resonator 421 and therefore the resonant wavelength of the ring resonator 421.

The bus waveguide 430 also includes an output portion 430b that provides output light 405b. This output light 405b can be the portion of the input light 405a not absorbed by the two detectors 410a and 420b. In FIG. 4, the input portion 430a and the output portion 430b are two sections of the same bus waveguide 430. Either or both of these portions can also be implemented as separate waveguides, evanescently coupled to one or both of the detectors 410 and 420. For example, a separate waveguide 440 can be used as the output waveguide.

In one example, the first germanium detector 410 and the second germanium detector 420 have the same operating wavelength (i.e., the two detectors absorb the same spectral components from the input light 405a). In this case, the apparatus 400 can also be used as a filter and the two detectors 410 and 420 can increase the extinction ratio of the filter. In another example, the first germanium detector 410 and the second germanium detector 420 can have different operating wavelengths (i.e., each detector sense light at a different wavelength or over a different range of wavelengths). In this case, multiple spectral components can be detected using the same apparatus 400.

In one example, the two ring resonators 411 and 421 can have the same diameter. In another example, the two ring resonators 411 and 421 can have different diameters. Without being bound by any particular theory or mode of operation, the resonant wavelength $\lambda_{res}$ of a ring resonator having a diameter d can be estimated by $\lambda_{res} = n_{eff} \pi d/m$, where m is the order of optical mode in resonance with the ring resonator, and $n_{eff}$ is the effective refractive index experienced by light guided in the ring resonator.

In one example, the first diameter of the first ring resonator 411 can be larger than the second diameter of the second resonator 421. The second diameter can be about 10% to about 95% of the first diameter (e.g., about 10%, about 15%, about 20%, about 25%, about 30%, about 35%, about 40%, about 45%, about 50%, about 55%, about 60%, about 65%, about 70%, about 75%, about 80%, about 85%, about 90%, or about 95%, including any values and sub ranges in between).

In one example, the two ring resonators 411 and 421 are the same distance away from the bus waveguide 430. In another example, the first ring resonator 411 is at a first distance away from the bus waveguide 430 and the second ring resonator 421 is at a second distance, different from the first distance, away from the bus waveguide 430. In one example, these different distances (i.e. first distance and second distance) can achieve different matching between the internal quality factor and the external quality factor of the respective resonator. For example, the first internal quality factor and the first external quality factor of the first ring resonator 411 can be substantially equal, while the second internal quality factor and the second external quality factor of the second ring resonator 421 can be different.

Alternatively, the different distances may help achieve the same matching. For example, the two ring resonators 411 and 421 can have different internal qualities factors due to different materials used in the ring resonators or different dimensions. On the other hand, the difference in the distance away from the bus waveguide 430 can affect the external quality factor. Therefore, adjusting the distance between the ring resonator 411 and/or 421 can compensate for this difference in the internal quality factor and lead to matching of the internal/external quality factor in both ring resonators 411 and 421.

The two ring resonators 411 and 421 in the apparatus 400 shown in FIG. 4 are disposed on two sides of the input waveguide 430a. In another example, the two ring resonators 411 and 421 can be disposed on the same side along the input waveguide 430a. In yet another example, the first ring resonator 411 can be evanescently coupled to the input waveguide 430a and the second ring resonator 421 can be evanescently coupled to the first ring resonator 411. In yet another example, the two ring resonators 411 and 421 can be substantially concentric with each other.

Figure 5:
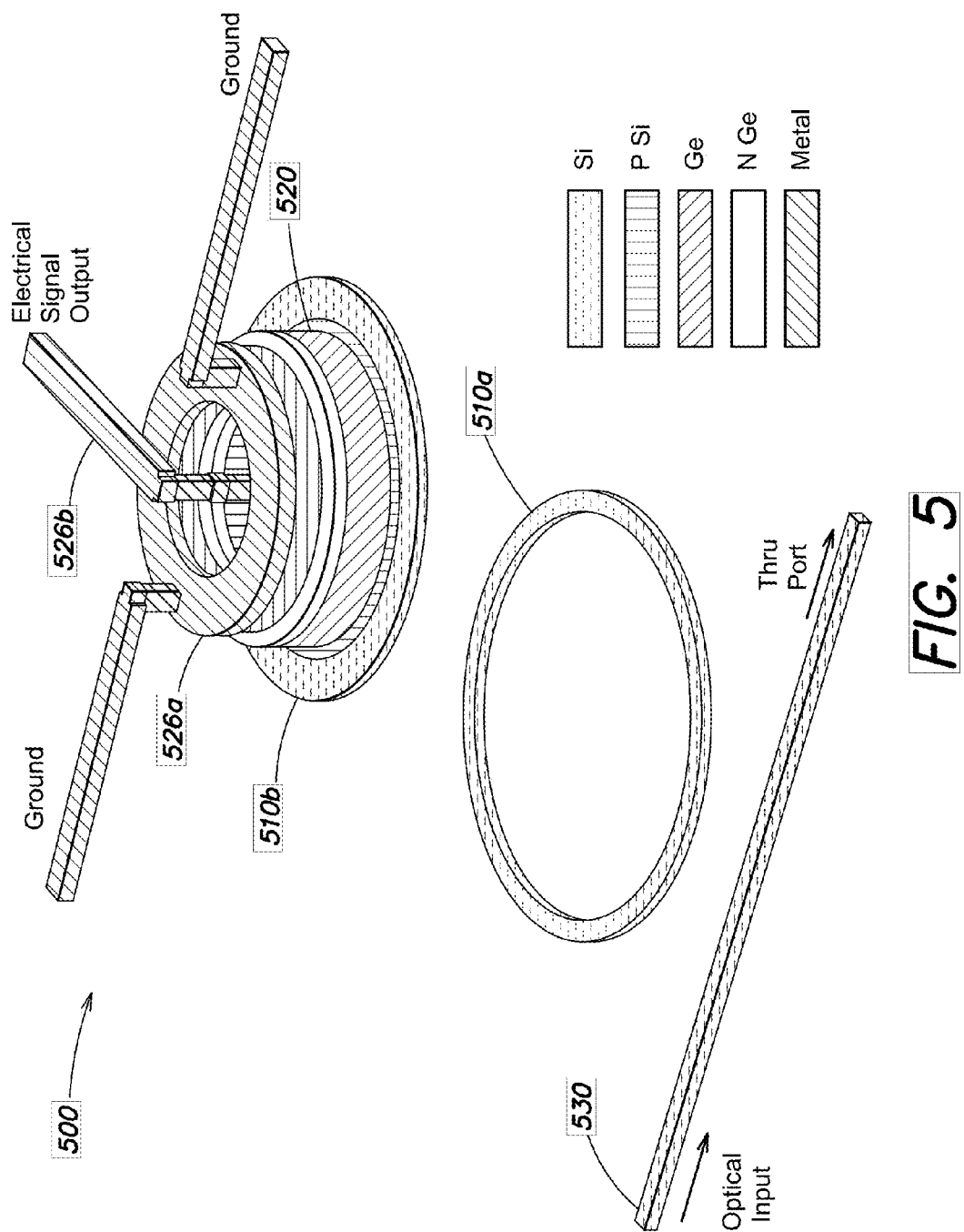
FIG. 5 shows a schematic of an apparatus including two ring resonators evanescently coupled to each other.

FIG. 5 shows a schematic of an apparatus 500 including two ring resonators 510a and 510b disposed on the same side of an input waveguide 530. The first ring resonator 510a is evanescently coupled to the input waveguide 530, and the second ring resonator 510b is evanescently coupled to the first ring resonator 510a. A germanium layer 520 is evanescently coupled to the second ring resonator 510b. Two electrodes 526a and 526b are electrically coupled to the germanium layer 520 to apply a bias voltage. The response from the apparatus 500 can be similar to a second order filter response, while the optical power is converted to photo current in the germanium layer 520.

Figure 6:
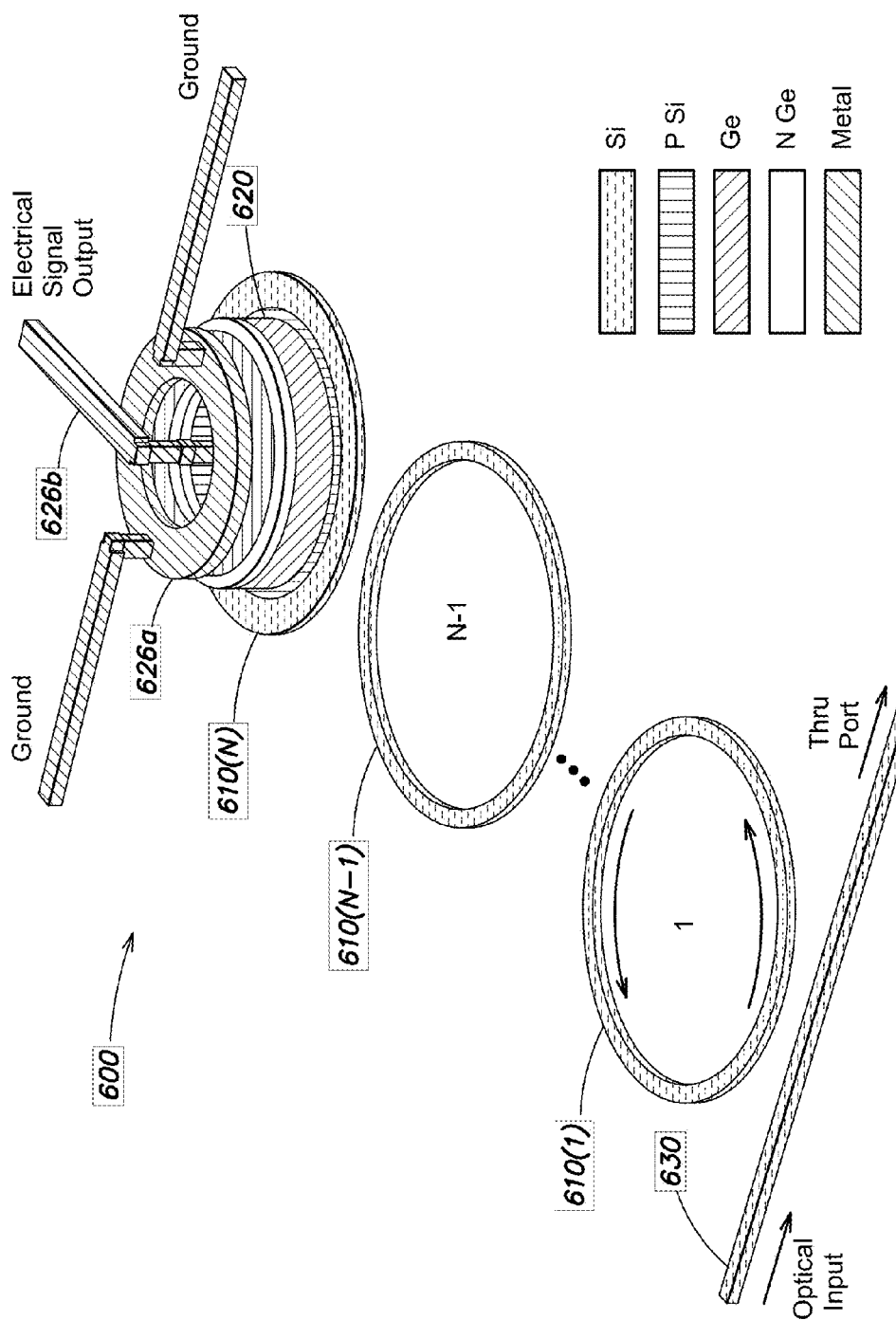
FIG. 6 shows a schematic of an apparatus including multiple ring resonators disposed in a cascade configuration.

FIG. 6 shows a schematic of an apparatus 600 including multiple ring resonators 610(1) to 610(N) disposed in a cascade configuration. The first ring resonator 610(1) is evanescently coupled to an input waveguide 630. The second ring resonator (not shown) is evanescently coupled to the first ring resonator 610(1). The Nth ring resonator 610(N) is evanescently coupled to the (N−1)th ring resonator 610(N−1). A germanium layer 620 is evanescently coupled to the Nth ring resonator 610(N). Two electrodes 626a and 626b are electrically coupled to the germanium layer 620 to apply a bias voltage. The response from the apparatus 600 can be similar to an Nth order filter response, while the optical power is converted to photo current in the germanium layer 620.

Figure 7:
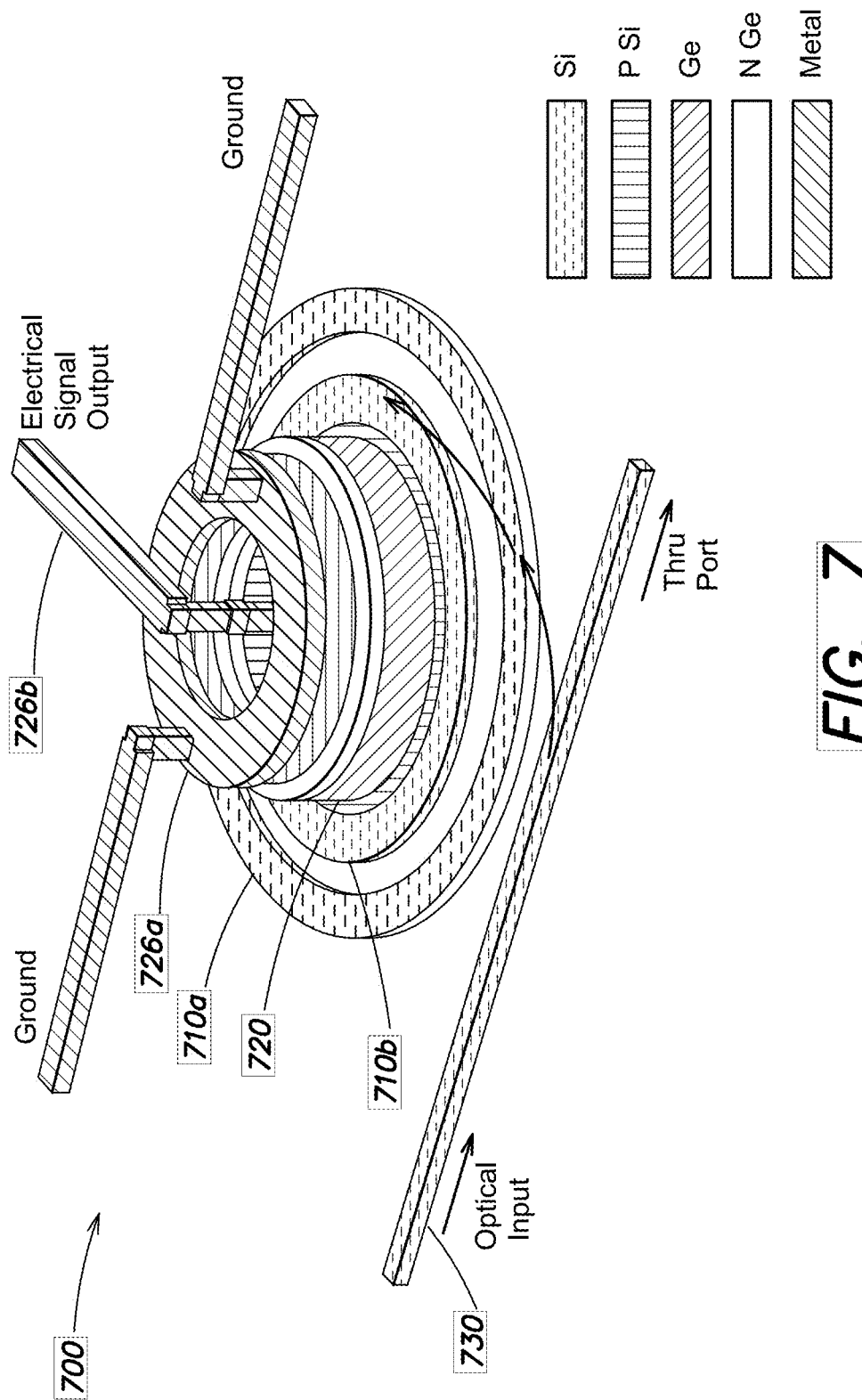
FIG. 7 shows a schematic of an apparatus including two ring resonators concentric to each other.

FIG. 7 shows a schematic of an apparatus 500 including two ring resonators 710a and 710b that are substantially concentric. The first ring resonator 710a is evanescently coupled to an input waveguide 730. The second ring resonator 710b is disposed within the first ring resonator 710a and is evanescently coupled to the first ring resonator 710a. A germanium layer 720 is evanescently coupled to the second ring resonator 710b. Two electrodes 726a and 726b are electrically coupled to the germanium layer 720 to apply a bias voltage. The response from the apparatus 700 can be similar to a second order filter response, while the optical power is converted to photo current in the germanium layer 720.

The concentric configuration in FIG. 7 can also be extended to multiple ring resonators. In addition, the cascade configuration shown in FIG. 6 can also be combined with the concentric configuration shown in FIG. 7. For example, multiple ring resonators can be disposed in a cascade configuration, where the last ring resonator is then evanescently coupled to an outer ring resonator with one or more ring resonators disposed within the outer ring resonator.

Methods of Photodetection Using a Germanium Layer Coupled to a Resonator

Figure 8:
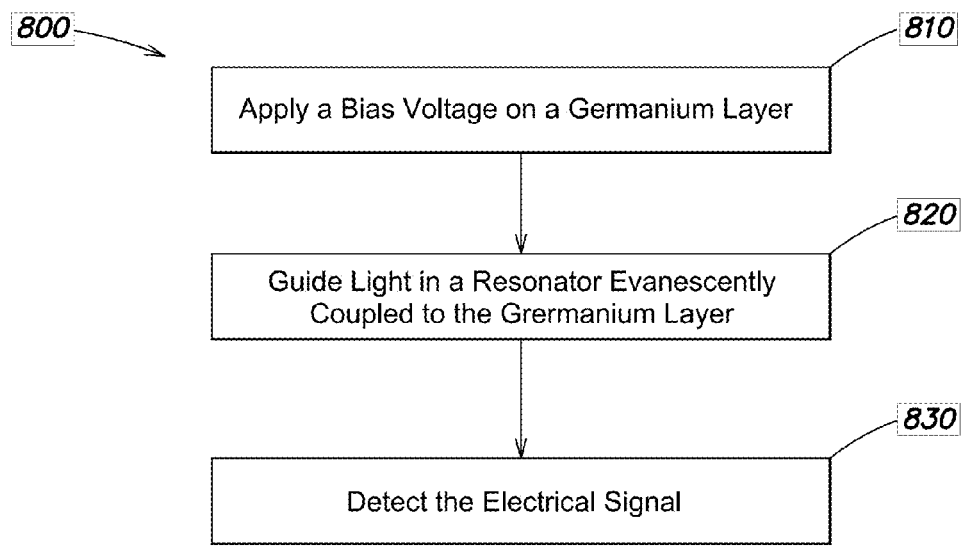
FIG. 8 illustrates a method of detecting light using germanium evanescently coupled to a resonator.

FIG. 8 illustrates a method 800 of photodetection using germanium layers evanescently coupled to a resonator. At 810, a bias voltage is applied on a germanium layer. At 820, light is guided in a resonator evanescently coupled to the germanium layer so as to cause the germanium layer to absorb at least a portion of the light guided in by resonator. The germanium layer converts the portion of the light absorbed by the germanium layer into an electrical signal under the bias voltage. At 830, the electrical signal is detected. The resonator and the germanium layer can be substantially similar to the resonators (e.g., 110, 210, 310, 411, and 421) and germanium layers (120, 220, 320, 412, and 422) described above.

In the method 800, the order of the steps 810 and 820 can be rearranged in any other order. For example, a user can guide the light into the resonator first and then apply the bias voltage. In this case, the light can be in continuous wave (CW) mode. In another example, the user can apply the bias voltage and transmit the light into the resonator concurrently. In this case, the light source that delivers the light and the voltage source that delivers the bias voltage can be controlled by the same switch.

The method 800 can further include changing the resonant wavelength of the resonator so as to change the spectral components to be detected. In one example, the resonant wavelength of the resonator can be changed by a heater in thermal communication with the resonator. In another example, the resonant wavelength of the resonator can be changed by a strain force applied on the resonator.

The method 800 can also include coupling the light not absorbed by the germanium layer out of the resonator. In one example, a user can couple out the light using the same waveguide that couples light into the resonator, a separate output waveguide evanescently coupled to the resonator, or both. In another example, the resonator can be a linear resonator and a user can couple out the guided light via one of the end couplers (e.g., 312b in FIG. 3).

The method 800 can also include propagating the light not absorbed by the germanium layer into another resonator evanescently coupled to another germanium layer (e.g., using the apparatus shown in FIG. 4). In one example, the two resonators have the same resonant wavelength and can increase the detection reliability as well as the extinction ratio when used for filtering. In another example, the two resonators can have different resonant wavelengths, in which case the method 800 can be used to detect multiple spectral components concurrently.

Characterization of Germanium-On-Silicon Photodetectors

Figure 9:
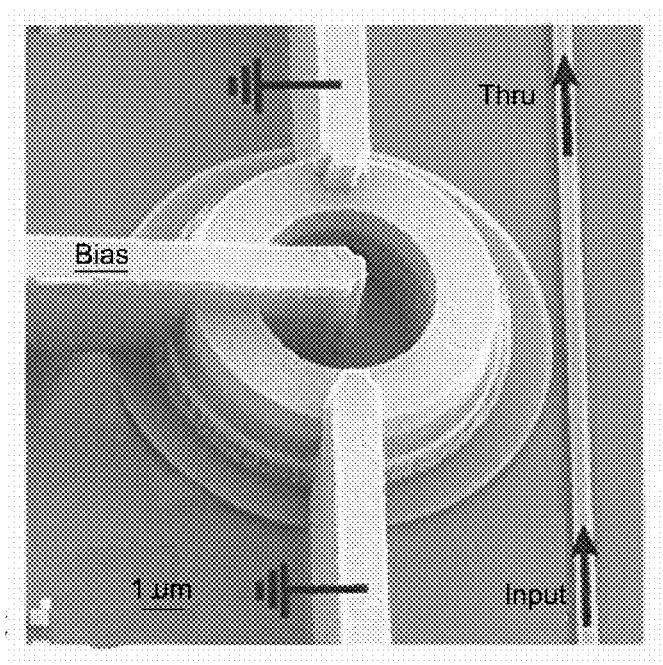
FIG. 9 is a scanning electron microscope (SEM) image of a photodetector like the one shown in FIGS. 1A and 1B.

FIG. 9 shows a scanning electron microscope (SEM) images of a resonant-based germanium-on-silicon detector like the detector 100 shown in FIGS. 1A-1B, after reactive ion etching (RIE) of top $SiO_2$ cladding. The device was fabricated on a 300-mm silicon-on-insulator (SOI) wafer with 220 nm silicon layer and 2 µm buried oxide (BOX) layer using 193-nm optical immersion lithography. The germanium layer (about 0.8 µm thick) is hetero-epitaxially grown into deep oxide trenches on top of the thin silicon photonic layer.

Input power from bus waveguide is coupled into the resonator and absorbed inside the cavity. Without being bound by any particular theory, the photodetector responsivity can be primarily limited by the generation of electron-hole pairs within the intrinsic germanium and the loss mechanisms that do not contribute to the generation of electron-hole pairs. The bend loss of the resonator can be negligible for a 4.5 µm radius resonator and a high index contrast between the silicon and silicon dioxide.

The lossy regions within the cavity includes the P doped silicon, N doped germanium, metal electrodes, and metal vias. The overlap between the resonant mode and lossy regions can be reduced to increase photodetector responsivity. The distance between germanium and silicon outer-radius ($\Delta R_{Si-Ge}$) can be selected to be 1.5 µm to allow a small tail of the resonant mode to be in the intrinsic germanium (i-Ge), reducing overlap with lossy regions.

Figure 10:
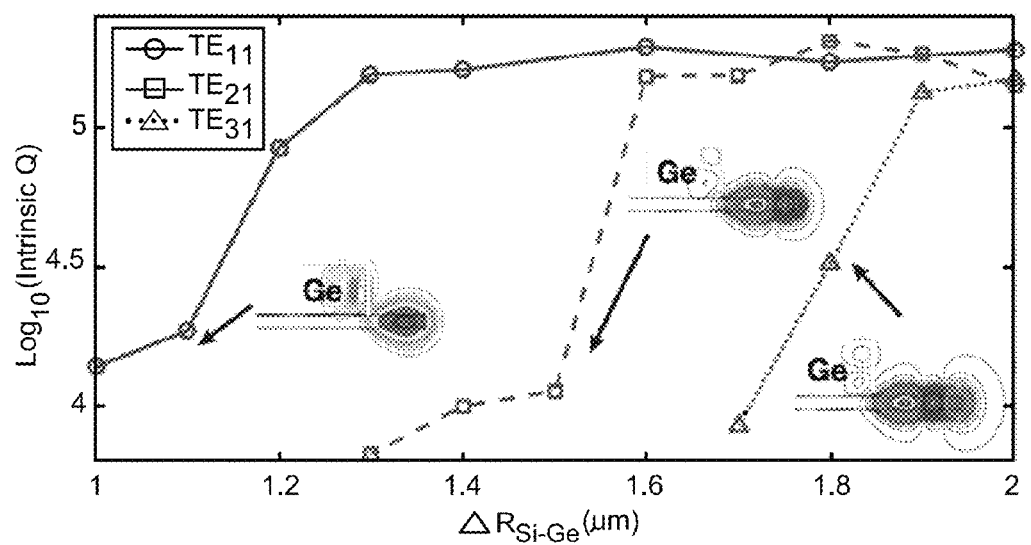
FIG. 10 shows measured internal quality factors of a resonator in a photodetector like the one shown in FIGS. 1A and 1B for three transverse-electric (TE) modes $TE_{11}$, $TE_{21}$, and $TE_{31}$ at 1530 nm as a function of the silicon to germanium separation $\Delta R_{Si-Ge}$.

FIG. 10 shows measured internal or intrinsic Qs of a photodetector for three transverse-electric (TE) modes $TE_{11}$, $TE_{21}$, and $TE_{31}$ at about 1530 nm as a function of the silicon to germanium separation $\Delta R_{Si-Ge}$. The intrinsic Q-factors of the resonators are estimated by fitting measured transmission spectra of a set of under-coupled resonant detectors to coupled-mode-theory model. The silicon to germanium separations $\Delta R_{Si-Ge}$ used in FIG. 10 are between 1.0 µm and 2.0 µm.

FIG. 10 shows that as the separation $\Delta R_{Si-Ge}$ gets smaller, the intrinsic Q-factor of the mode inside the cavity decreases, indicating that more light power leaks out of the ring resonator. For example, the light guided in the ring resonator is more likely to be coupled into the germanium layer, i.e., increasing mode overlap with the germanium layer. The mode shapes can also affect the mode overlap with the germanium layer. Generally, higher order modes are less confined. For example, in the inlets of FIG. 10, the $TE_{11}$ mode is mostly confined within the resonator (i.e. the tip on the right), while the $TE_{31}$ mode has only a relatively weak light field center within the resonator and two strong light field centers outside the resonator. This can result in germanium absorption limited intrinsic Q factors occurring at $\Delta R_{Si-Ge}$=1.1, 1.5, and 1.8 µm for $TE_{11}$, $TE_{21}$ and $TE_{31}$ modes. This analysis is in agreement with the corresponding mode profiles shown in the inlets of FIG. 10.

Figure 11:
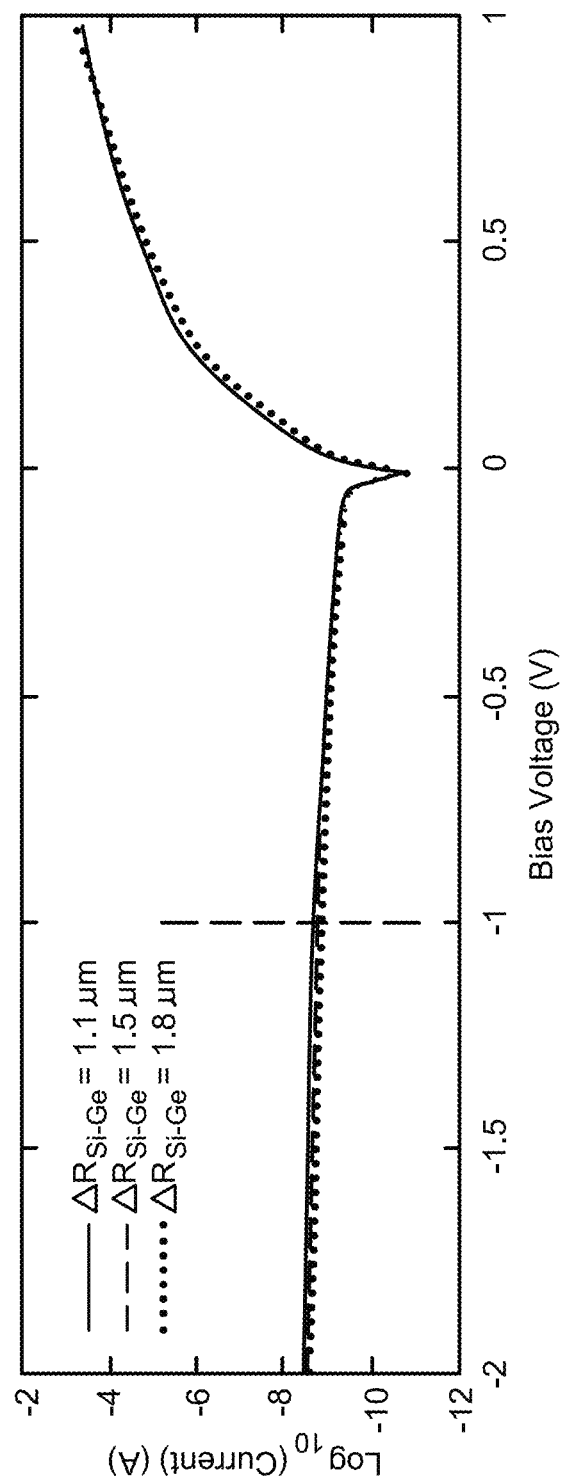
FIG. 11 shows I-V curves of photodetector like the one shown in FIGS. 1A and 1B with $\Delta R_{Si-Ge}$=1.1, 1.5 and 1.8 μm at −1 V bias voltage.

FIG. 11 shows I-V curves of resonant detectors with $\Delta R_{Si-Ge}$=1.1, 1.5, and 1.8 µm, showing nA scale dark current at −1 V bias voltage. These I-V curves for germanium p-i-n diodes show that the dark current of the device with $\Delta R_{Si-Ge}$ of 1.1 µm is about 2.03 nA at −1 V bias voltage, corresponding to a dark current density of 8.13 $mA/cm^2$. In addition, changing the germanium-silicon separation $\Delta R_{Si-Ge}$ does not significantly change the dark current. In other words, the dark current of the photodetector can be maintained at a low level with different germanium-silicon separations $\Delta R_{Si-Ge}$.

Figure 12C:
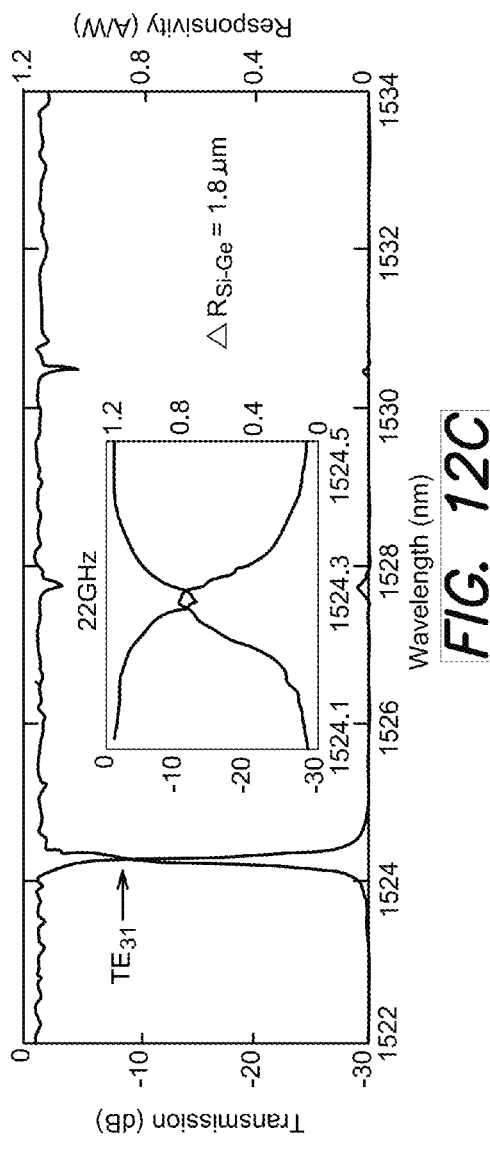

FIGS. 12A-12C show measured transmission spectra and responsivities for photodetectors with $\Delta R_{Si-Ge}$=1.1, 1.5, and 1.8 µm, respectively, at a bus-to-resonant detector gap of 100 nm for wavelength around 1528 nm. The insets show close-ups of the spectra around the resonances, showing filter bandwidths of 15, 50, and 22 GHz.

For characterizing responsivities of the detectors, a TE polarized tunable laser was coupled in and out of the fabricated chip using single mode-fiber (SMF) and the transmission spectra of the through port were recorded using an external detector. A ground-signal-ground (GSG) high-speed probe was contacted to device. A Keithley source-meter was used to reverse bias the photodetector and the photocurrent was measured using the source-meter.

The transmission spectra together with the measured responsivity curves for different modes with 100 nm coupling gap size are shown in FIGS. 12A-12C. When the input laser wavelength is on resonance, light is trapped and absorbed in the cavity. The light absorbed by the intrinsic germanium is converted to photocurrent, shown as the photocurrent peaks on FIGS. 12A-12C. A responsivity as high as 1.04 A/W is achieved for the device with $\Delta R_{Si-Ge}$=1.5 µm and a gap of 100 nm at a wavelength of 1528 nm.

The inlets in FIGS. 12A-12C show different optical full-width-half-maximum (FWHM) bandwidths that were observed for different orders of modes, determined by the total Q-factors of the resonant cavities. FIG. 12A shows that the optical bandwidth for $TE_{11}$ mode is about 15 GHz. FIG. 12B shows that the optical bandwidth for $TE_{21}$ mode is about 50 GHz. FIG. 12C shows that the optical bandwidth for $TE_{31}$ mode is about 22 GHz.

Figure 13:
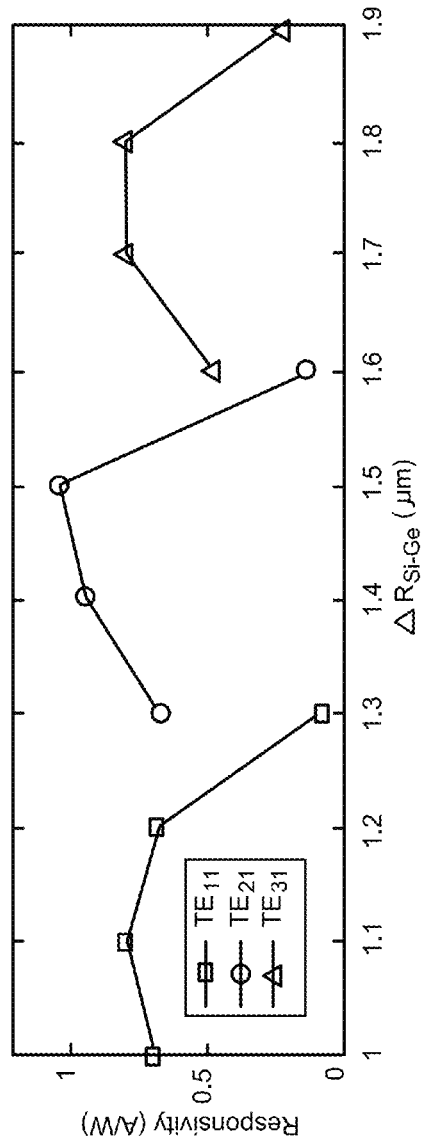
FIG. 13 shows measured responsivities of photodetectors with different germanium-to-silicon separations $\Delta R_{Si-Ge}$ and a gap size of 100 nm for optical modes $TE_{11}$, $TE_{21}$ and $TE_{31}$ at about 1528 nm.

FIG. 13 shows measured responsivities of photodetectors with different germanium-to-silicon separations $\Delta R_{Si-Ge}$ for modes $TE_{11}$, $TE_{21}$, and $TE_{31}$ at 1528 nm with a gap size of 100 nm. Peak responsivities for different modes (e.g. 1.1 µm for $TE_{11}$ 1.5 µm for $TE_{21}$ and 1.7 µm for $TE_{31}$) are observed, corresponding to matched Q-factor points of individual mode. With resonant nature, each of the devices demonstrated here can also act as a wavelength-selective photodetector, combining the functions of wavelength filtering and detection of input signals. Furthermore, the structure can be optimized with a pulley coupling scheme (see, e.g., FIG. 1C) to allow for selective coupling to a certain mode while maintaining large coupling coefficient into the cavity. This scheme can remove the additional excitations of other modes and extend the free-spectral-range (FSR) of the device.

As discussed above, to optimize responsivity of the resonant detector, the external Q-factor can match the intrinsic Q-factor. Though the loss associated with intrinsic germanium absorption can decrease rapidly at longer wavelengths, the intrinsic Q-factor of the resonator increases slowly as a result of mode expansion at longer wavelength. As a result, it is possible for a single device to maintain a relatively high responsivity at both short wavelengths (e.g., less than 1520 nm) and long wavelengths (e.g., greater than 1580 nm) with a fixed coupling gap.

Figure 14C:
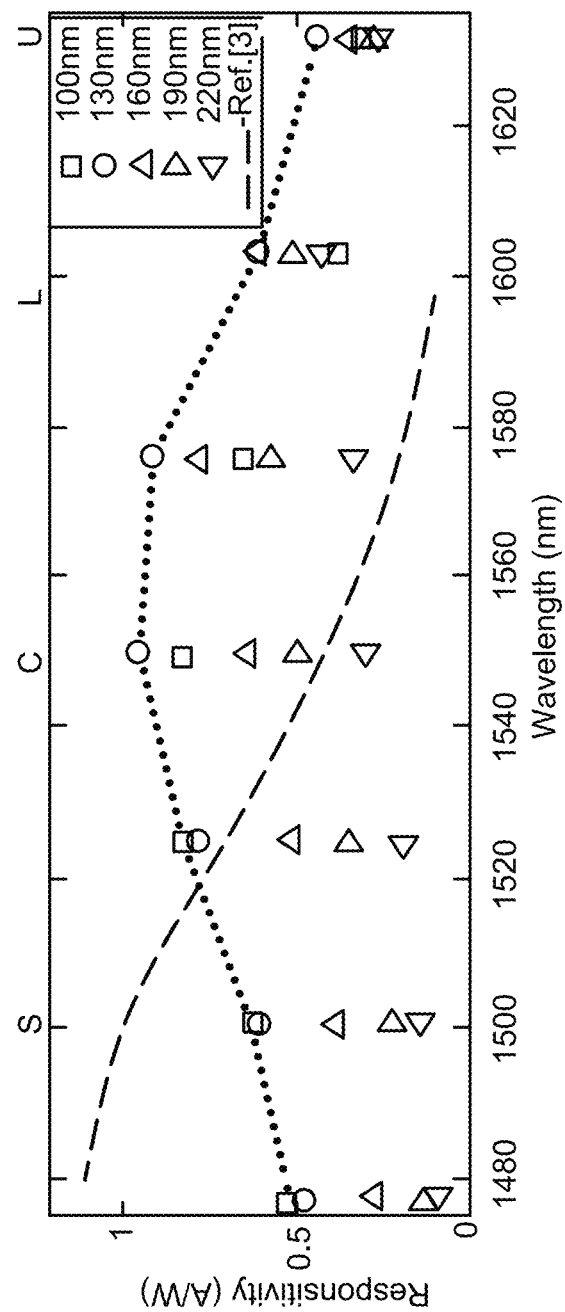

FIGS. 14A-14C show measured responsivities for different resonant wavelengths and coupling gap sizes for $\Delta R_{Si-Ge}$ sizes of 1.1 µm, 1.4 µm, and 1.7 µm, respectively. For device with $\Delta R_{Si-Ge}$=1.4 µm and coupling gap size of 100 nm, responsivity as high as 0.8 A/W is achieved for short wavelength while maintaining a relatively high responsivity of 0.3 A/W for wavelengths up to 1630 nm, which agrees with our expectation for longer wavelength range detection within a single device. With optimized coupling gap, a responsivity as high as 0.45 A/W is achieved for wavelength at around 1630 nm for device with $\Delta R_{Si-Ge}$=1.7 µm and coupling gap size of 130 nm.

Responsivities of conventional devices are also shown as dashed lines in FIGS. 14A-14C for a comparison. It can be observed that more than five times increase in responsivity at longer wavelengths (e.g., longer than 1580 nm) is achieved by utilizing resonant structures.

Figure 15A:
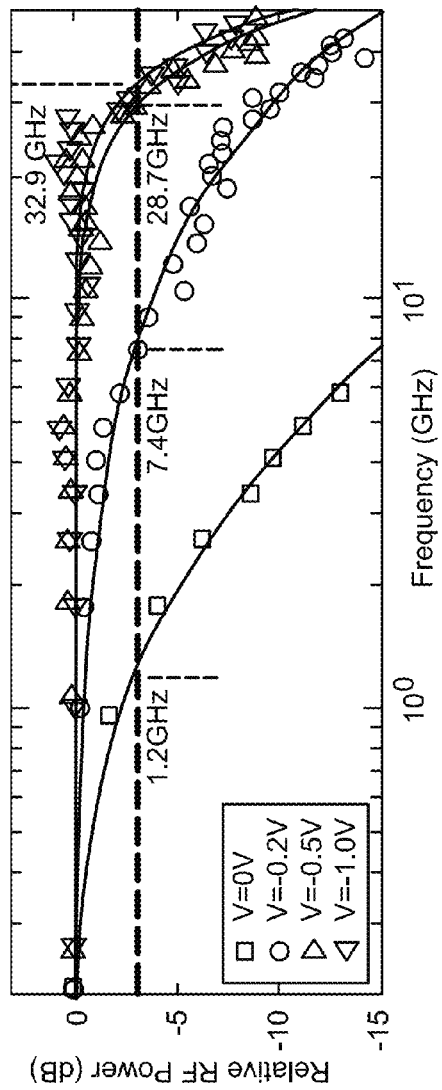
FIG. 15A shows measured bandwidths of photodetectors with a germanium-to-silicon separation $\Delta R_{Si-Ge}$ of 1.5 μm and a coupling gap of 100 nm under different bias voltages.
Figure 15B:
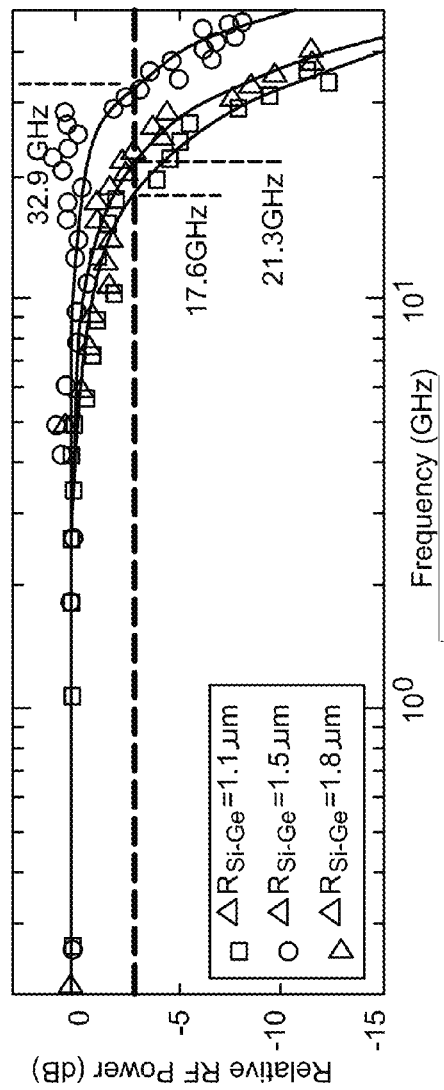
FIG. 15B shows measured bandwidths of photodetectors with a coupling gap of 100 nm and germanium-to-silicon separations $\Delta R_{Si-Ge}$ of 1.1 μm, 1.5 μm, and 1.8 μm at −1 V bias voltage.

FIG. 15A shows measured bandwidths of photodetectors with a germanium-to-silicon separation $\Delta R_{Si-Ge}$ of 1.5 µm and a coupling gap of 100 nm under different bias voltages. The plots show 3 dB bandwidth of 32.9 GHz for −1 V bias. FIG. 15B show measured bandwidths of photodetectors with a coupling gap of 100 nm and germanium-to-silicon separation $\Delta R_{Si-Ge}$ of 1.1 µm, 1.5 µm, and 1.8 µm at −1 V bias voltage. These plots show bandwidths of 17.6 GHz, 32.9 GHz, and 21.3 GHz respectively.

The electro-optic bandwidths can be investigated to study the effects of photon lifetime, transit time, and RC bandwidth. The electro-optic bandwidth of the photodetector was measured using the heterodyne laser technique. FIG. 12A shows the measured bandwidth of the photodetector with $\Delta R_{Si-Ge}$=1.5 µm and coupling gap size of 100 nm for input wavelength at around 1528 nm under different bias voltages. The detector bandwidth is increased from 12 GHz under zero bias to 32.9 GHz under −1 V or more reverse bias, indicating the velocity saturation voltage.

Bandwidths for devices with 100 nm gap size and different $\Delta R_{Si-Ge}$ sizes are shown in FIG. 15B. In cases with $\Delta R_{Si-Ge}$=1.1 µm and 1.8 µm, the bandwidths are 17.6 GHz and 21.3 GHz, respectively. These bandwidths can be limited by the optical bandwidths or photon lifetime of the resonators (15 GHz for $\Delta R_{Si-Ge}$=1.1 µm and 22 GHz for $\Delta R_{Si-Ge}$=1.8 µm, shown in FIGS. 12A and 12C, respectively). However, for $\Delta R_{Si-Ge}$=1.5 µm, the bandwidth is limited to 32.9 GHz, which is less than the optical bandwidth (50 GHz, shown in inset of FIG. 12B) of the device limited by the transit time.

Figure 16:
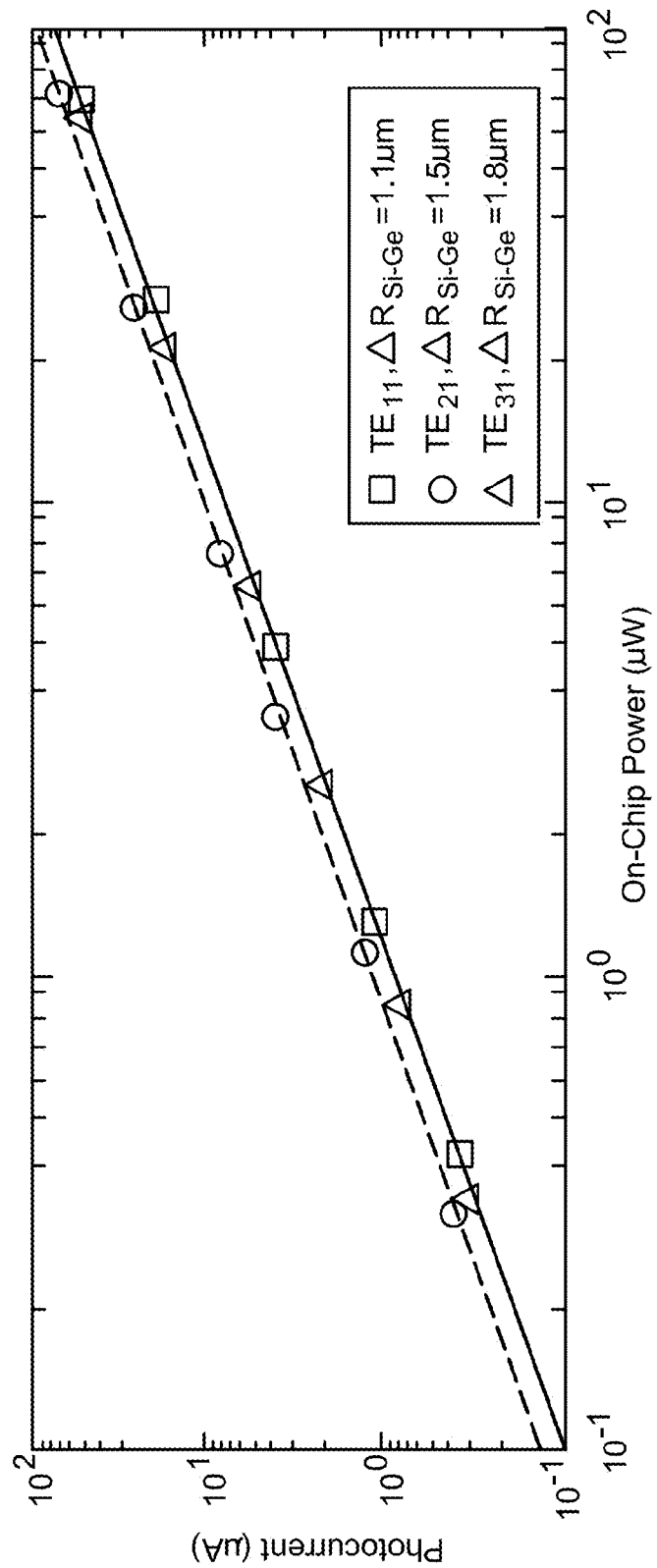
FIG. 16 shows measured photocurrent as a function of on-chip power for different modes in photodetectors with germanium-to-silicon separations $\Delta R_{Si-Ge}$ of 1.1 μm, 1.5 μm, and 1.8 μm at a laser wavelength of 1528 nm.

FIG. 16 shows measured photocurrent on resonance as a function of on-chip power for different modes in a photodetector with $\Delta R_{Si-Ge}$ of 1.1 µm, 1.5 µm, and 1.8 µm at a laser wavelength of 1528 nm. The plots in FIG. 16 show linear response over more than two decades in power (from about 0.3 µW to about 80 µW) for all devices. Thus, the detection can be well suited for analog, microwave, and long-haul photonic applications where shot-noise limited spur-free detection is desired.

FIGS. 10-16 demonstrate photodetectors having a compact size (e.g., 4.5 µm radius), low dark current (e.g., as low as 2.03 nA), high-responsivity (e.g., about 1.04 A/W), and high-bandwidth (e.g., 32.9 GHz). With the resonant nature of the photodetectors, the detection wavelength range can be further extended to 1630 nm with responsivity greater than 0.30 A/W, making it possible to handle S, C and L band power detection using the same device. Besides, resonant detectors are suited for simplifying architectures of WDM and multicasting network. A WDM system where each channel is filtered and received and a multicast network where a wavelength channel is rooted to multiple end points can be readily achieved using cascaded resonant germanium-on-silicon detectors.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:
1. An apparatus comprising:
  a resonator to guide light, the resonator having an internal quality factor (Q);
  a germanium layer, evanescently coupled to the resonator, to absorb at least a portion of the light guided by the resonator, the germanium layer having an external quality factor substantially equal to the internal Q of the ring resonator, a first side, and a second side opposite the first side;
  a first electrode disposed on the first side of the germanium layer; and
  a second electrode, disposed on the second side of the germanium layer, to apply a bias voltage on the germanium layer.

2. The apparatus of claim 1, wherein the resonator comprises a ring resonator and the germanium layer comprises a germanium arcuate member at least partially concentric with the ring resonator.

3. The apparatus of claim 2, wherein germanium arcuate member comprises a germanium ring substantially concentric with the ring resonator.

4. The apparatus of claim 3, wherein a distance between an outer edge of the ring resonator and an outer edge of the germanium ring is about 0.1 µm to about 2 µm.

5. The apparatus of claim 3, further comprising:
an input waveguide, evanescently coupled to the ring resonator, to couple the light into the ring resonator.

6. The apparatus of claim 5, wherein the input waveguide and the ring resonator define a gap with a width of about 50 nm to about 250 nm.

7. The apparatus of claim 5, wherein the input waveguide has an external Q substantially equal to the internal Q of the ring resonator.

8. The apparatus of claim 3, further comprising:
a heater, operably coupled to the ring resonator, to change a resonant wavelength of the ring resonator.

9. The apparatus of claim 1, wherein the resonator has a resonant wavelength greater than 1.5 µm.

10. The apparatus of claim 1, wherein the germanium layer has a thickness of about 0.01 µm to about 1 µm.

11. The apparatus of claim 1, further comprising:
an output waveguide, evanescently coupled to the resonator, to couple another portion of the light out of the resonator.

12. The apparatus of claim 1, wherein the resonator is a first resonator, the germanium layer is a first germanium layer, and the apparatus further comprises:
a second resonator, in optical communication with the first resonator, to guide the light not absorbed by the first germanium layer; and
a second germanium layer, evanescently coupled to the second resonator, to absorb the light guided in the second resonator.

13. The apparatus of claim 12, wherein the first resonator has a first resonant wavelength and the second resonator has a second resonant wavelength different from the first resonant wavelength.

14. The apparatus of claim 1, wherein the germanium layer has a detection responsivity greater than 1 A/W at a wavelength greater than 1500 nm.

15. The apparatus of claim 1, wherein the germanium layer has a detection bandwidth greater than 30 GHz at a wavelength greater than 1500 nm.

16. The apparatus of claim 1, further comprising:
a voltage source, in electrical communication with the first electrode and the second electrode, to apply the bias voltage, the bias voltage being within a range of about 0.2 V to about 15 V.

17. An apparatus comprising:
a ring resonator to guide light;
a germanium ring, substantially concentric with and evanescently coupled to the ring resonator, to absorb at least a portion of the light guided by the ring resonator, the germanium ring having a first side and a second side opposite the first side;
a first electrode disposed on the first side of the germanium ring; and
a second electrode, disposed on the second side of the germanium ring, to apply a bias voltage on the germanium ring,
wherein the ring resonator has a first mean diameter and the germanium ring has a second mean diameter less than the first mean diameter.

18. An apparatus comprising:
a resonator to guide light;
a germanium layer, evanescently coupled to the resonator, to absorb at least a portion of the light guided by the resonator, the germanium layer having a first side and a second side opposite the first side;
a first electrode disposed on the first side of the germanium layer; and
a second electrode, disposed on the second side of the germanium layer, to apply a bias voltage on the germanium layer,
wherein the first electrode comprises doped germanium, the resonator comprises silicon, and the second electrode comprises doped silicon.

19. A method of detecting light, comprising:
applying a bias voltage on a germanium layer having an external quality factor (Q);
guiding the light in a resonator evanescently coupled to the germanium layer so as to cause the germanium layer to absorb at least a portion of the light guided by the resonator, the germanium layer converting the at least a portion of the light into an electrical signal and the resonator having an internal Q substantially equal to the external Q of the germanium layer; and
detecting the electrical signal.

20. The method of claim 19, wherein guiding the light comprises guiding the light in a ring resonator evanescently coupled to a germanium ring substantially concentric with the ring resonator.

21. The method of claim 20, further comprising:
coupling the light into the ring resonator via an input waveguide evanescently coupled to the ring resonator, the input waveguide and the ring resonator separated by a gap of about 50 nm to about 250 nm.

22. The method of claim 20, further comprising:
changing a temperature of the ring resonator so as to change a resonant wavelength of the ring resonator.

23. The method of claim 20, further comprising:
coupling the light not absorbed by the germanium layer out of the ring resonator.

24. The method of claim 19, wherein the resonator is a first resonator, the germanium layer is a first germanium layer, and further comprising:
coupling the light not absorbed by the germanium layer out of the first resonator and into a second resonator evanescently coupled to a second germanium layer so as to cause the second germanium layer to absorb at least a portion of the light guided by the second resonator.

25. The method of claim 24, wherein coupling the light beam into the second resonator comprises coupling the light beam into the second resonator having a second resonant wavelength different from a first resonant wavelength of the first resonator.

26. A semiconductor photodetector, comprising:
a ring resonator to guide light at a wavelength greater than about 1500 nm, the ring resonator having an internal quality factor and an external quality factor approximately equal to the internal quality factor;
an input waveguide, disposed about 50 nm to about 250 nm away from the ring resonator, to couple the light into the ring resonator;
a germanium arcuate member, evanescently coupled to the ring resonator and substantially concentric with the ring resonator, to absorb at least a portion of the light guided in the ring resonator, the ring resonator having an outer edge disposed about 1 µm to about 2 µm away from an outer edge of the germanium arcuate member; and
a pair of electrodes, in electrical communication with the germanium arcuate member, to apply a bias voltage to the germanium arcuate member.

* * * * *